United States Patent
Sau et al.

(10) Patent No.: US 11,756,947 B2
(45) Date of Patent: Sep. 12, 2023

(54) LIGHT-EMITTING DIODE LIGHTING SYSTEM WITH WIREBONDED HYBRIDIZED DEVICE

(71) Applicant: LUMILEDS LLC, San Jose, CA (US)

(72) Inventors: Wan-Ying Sau, Bayan Lepas (MY); Ronald Johannes Bonne, Plainfield, IL (US); Zhi Hua Song, Palo Alto, CA (US)

(73) Assignee: Lumileds LLC, San Jose, CA (US)

(*) Notice: Subject to any disclaimer, the term of this patent is extended or adjusted under 35 U.S.C. 154(b) by 199 days.

(21) Appl. No.: 16/934,897

(22) Filed: Jul. 21, 2020

(65) Prior Publication Data

US 2021/0249395 A1 Aug. 12, 2021

Related U.S. Application Data

(60) Provisional application No. 62/970,975, filed on Feb. 6, 2020.

(51) Int. Cl.
*H01L 23/00* (2006.01)
*H01L 25/18* (2023.01)
(Continued)

(52) U.S. Cl.
CPC .............. *H01L 25/50* (2013.01); *H01L 24/73* (2013.01); *H01L 24/92* (2013.01); *H01L 25/167* (2013.01); *H01L 25/18* (2013.01); *H01L 33/486* (2013.01); *H01L 33/56* (2013.01); *H01L 33/62* (2013.01); *H01L 2224/73207* (2013.01); *H01L 2224/73265* (2013.01); *H01L 2224/92127* (2013.01)

(58) Field of Classification Search
CPC combination set(s) only.
See application file for complete search history.

(56) References Cited

U.S. PATENT DOCUMENTS 6,005,649 A    12/1999  Krusius et al.
6,048,753 A     4/2000  Farnworth et al.
(Continued)

FOREIGN PATENT DOCUMENTS

KR   10-2018-0035206 A   4/2018
WO      2006/099741 A1   9/2006
WO      2018/063624 A1   4/2018

OTHER PUBLICATIONS

U.S. Appl. No. 16/934,905, filed Jul. 21, 2020, which claims the benefit of U.S. Appl. No. 62/970,975, filed Feb. 6, 2020.
(Continued)

*Primary Examiner* — Sue A Purvis
*Assistant Examiner* — Jordan M Klein
(74) *Attorney, Agent, or Firm* — Volpe Koenig

(57) ABSTRACT

Light-emitting devices are described herein. A device includes a packaging substrate having a top surface and a bottom surface and a hybridized device having a bottom surface on the top surface of the packaging substrate. The hybridized device includes a silicon backplane that includes input/output (I/O) pins and a light-emitting diode (LED) array having a bottom surface on a top surface of the silicon backplane. Passive components are disposed on the top surface of the packaging substrate. Conductive connectors are electrically coupled between the top surface of the hybridized device and the top surface of the packaging substrate.

15 Claims, 18 Drawing Sheets

(51) Int. Cl.
  *H01L 25/16*  (2023.01)
  *H01L 33/48*  (2010.01)
  *H01L 33/62*  (2010.01)
  *H01L 25/00*  (2006.01)
  *H01L 33/56*  (2010.01)

(56) References Cited

U.S. PATENT DOCUMENTS

| | | | |
|---|---|---|---|
| 7,176,506 B2 | 2/2007 | Beroz et al. | |
| 8,101,967 B2 | 1/2012 | Nakai | |
| 8,129,734 B2 | 3/2012 | Mazzochette | |
| 8,431,423 B2 | 4/2013 | Basin et al. | |
| 8,716,735 B2 | 5/2014 | Hsu et al. | |
| 9,076,951 B2 | 7/2015 | Kong et al. | |
| 9,659,913 B2 | 5/2017 | Kobayakawa | |
| 10,453,827 B1 | 10/2019 | Hussell et al. | |
| 2006/0198570 A1 | 9/2006 | Ogawa et al. | |
| 2007/0228516 A1* | 10/2007 | Plank | H01L 25/0753 257/E25.032 |
| 2008/0093620 A1 | 4/2008 | Lee et al. | |
| 2009/0095971 A1 | 4/2009 | Glovatsky et al. | |
| 2009/0159905 A1 | 6/2009 | Chen | |
| 2010/0188720 A1 | 7/2010 | Nakamura et al. | |
| 2011/0024785 A1 | 2/2011 | Ng et al. | |
| 2012/0211774 A1 | 8/2012 | Harada | |
| 2013/0307016 A1 | 11/2013 | Lee | |
| 2015/0147022 A1 | 5/2015 | Matsuda | |
| 2015/0214194 A1 | 7/2015 | Yan | |
| 2015/0243865 A1 | 8/2015 | Feichtinger et al. | |
| 2015/0340569 A1 | 11/2015 | Tamaki et al. | |
| 2015/0349215 A1 | 12/2015 | Gootz et al. | |
| 2015/0369661 A1 | 12/2015 | Lin | |
| 2016/0035924 A1 | 2/2016 | Oraw et al. | |
| 2016/0351539 A1 | 12/2016 | Bower et al. | |
| 2017/0131591 A1 | 5/2017 | Rantala et al. | |
| 2017/0194533 A1 | 7/2017 | Liu et al. | |
| 2017/0254518 A1 | 9/2017 | Vasylyev | |
| 2017/0256680 A1* | 9/2017 | Liu | H01L 33/486 |
| 2017/0288102 A1 | 10/2017 | Farrens et al. | |
| 2018/0190563 A1 | 7/2018 | Magni | |
| 2018/0190712 A1 | 7/2018 | Xu et al. | |
| 2018/0211899 A1 | 7/2018 | Morianz et al. | |
| 2019/0115274 A1 | 4/2019 | Hu et al. | |
| 2019/0131208 A1* | 5/2019 | Feichtinger | H01L 23/36 |
| 2019/0259736 A1 | 8/2019 | Li et al. | |
| 2019/0371229 A1* | 12/2019 | Wang | H01L 33/387 |
| 2020/0098729 A1* | 3/2020 | Pendse | H01L 25/18 |
| 2020/0194614 A1 | 6/2020 | Pares | |
| 2021/0111318 A1 | 4/2021 | Lin et al. | |
| 2021/0141154 A1 | 5/2021 | Razdan et al. | |
| 2021/0320233 A1 | 10/2021 | Rao et al. | |

OTHER PUBLICATIONS

U.S. Appl. No. 16/934,911, filed Jul. 21, 2020, which claims the benefit of U.S. Appl. No. 62/970,975, filed Feb. 6, 2020.
U.S. Appl. No. 16/934,917, filed Jul. 21, 2020.
U.S. Appl. No. 16/934,919, filed Jul. 21, 2020.
International Search Report and Written Opinion dated May 14, 2021 for PCT International Application No. PCT/US2021/016752.
International Search Report and Written Opinion dated Jun. 4, 2021 for PCT International Application No. PCT/US2021/016748.
International Search Report and Written Opinion dated May 31, 2021 for PCT International Application No. PCT/US2021/016816.
Extended European Search Report dated Jan. 22, 2021 for European Patent Application No. 20190505.6.
Extended European Search Report dated Jan. 14, 2021 for European Patent Application No. 20190472.9.
International Search Report and Written Opinion dated Nov. 11, 2021 for PCT International Application No. PCT/US2021/042578.
International Search Report and Written Opinion dated Nov. 11, 2021 for PCT International Application No. PCT/US2021/042580.

* cited by examiner

US 11,756,947 B2

LIGHT-EMITTING DIODE LIGHTING SYSTEM WITH WIREBONDED HYBRIDIZED DEVICE

CROSS REFERENCE TO RELATED APPLICATION(S)

This application claims the benefit of U.S. Provisional Application No. 62/970,975, filed Feb. 6, 2020, which is incorporated by reference as if fully set forth.

BACKGROUND

Precision control lighting applications may require production and manufacturing of small addressable light-emitting diode (LED) lighting systems. The smaller size of such systems may require unconventional components and manufacturing processes.

SUMMARY

Light-emitting devices are described herein. A device includes a packaging substrate having a top surface and a bottom surface and a hybridized device having a bottom surface on the top surface of the packaging substrate. The hybridized device includes a silicon backplane that includes input/output (I/O) pins and a light-emitting diode (LED) array having a bottom surface on a top surface of the silicon backplane. Passive components are disposed on the top surface of the packaging substrate. Conductive connectors are electrically coupled between the top surface of the hybridized device and the top surface of the packaging substrate.

BRIEF DESCRIPTION OF THE DRAWINGS

A more detailed understanding can be had from the following description, given by way of example in conjunction with the accompanying drawings wherein.

DETAILED DESCRIPTION

Figure 1:
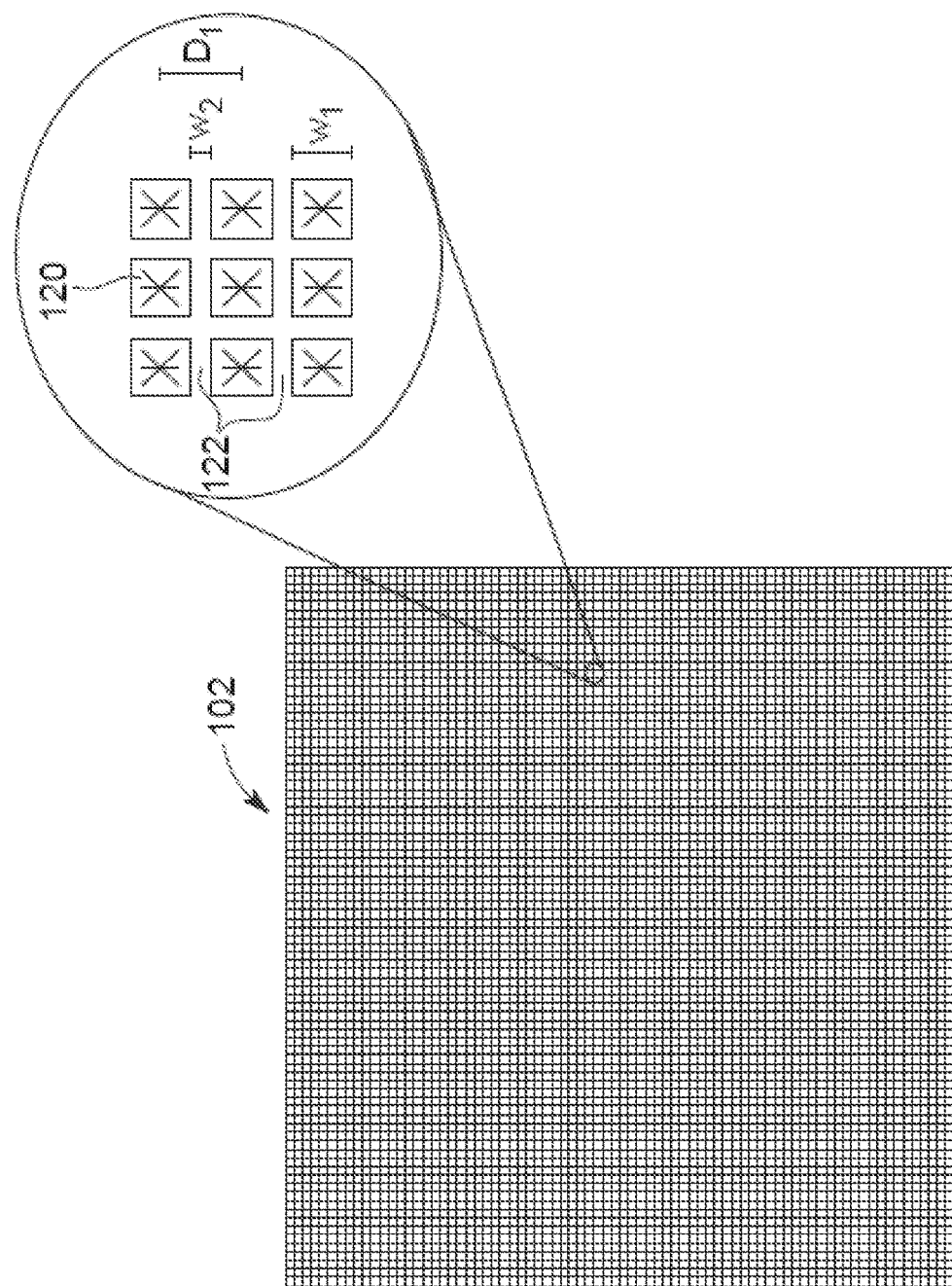
FIG. 1 is a top view of an example LED array.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Further, whether the LEDs, LED arrays, electrical components and/or electronic components are housed on one, two or more electronics boards may also depend on design constraints and/or application.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

LEDs may be arranged into arrays for some applications. For example, LED arrays may support applications that benefit from fine-grained intensity, spatial, and temporal control of light distribution. This may include, but is not limited to, precise spatial patterning of emitted light from pixel blocks or individual pixels. Depending on the application, emitted light may be spectrally distinct, adaptive over time and/or environmentally responsive. LED arrays may provide pre-programmed light distribution in various intensity, spatial or temporal patterns. The emitted light may be based at least in part on received sensor data and may be used for optical wireless communications. Associated electronics and optics may be distinct at an emitter, emitter block or device level.

LED arrays may be formed from one, two or three dimensional arrays of LEDs, VCSELs, OLEDs, or other controllable light emitting systems. LED arrays may be formed as emitter arrays on a monolithic substrate, formed by partial or complete segmentation of a substrate, formed using photolithographic, additive, or subtractive processing, or formed through assembly using pick and place or other suitable mechanical placement. LED arrays may be uniformly laid out in a grid pattern, or, alternatively, may be positioned to define geometric structures, curves, random, or irregular layouts.

FIG. 1 is a top view of an example LED array 102. In the example illustrated in FIG. 1, the LED array 102 is an array of emitters 120. Emitters 120 in the LED array 102 may be individually addressable or may be addressable in groups/subsets.

An exploded view of a 3×3 portion of the LED array 102 is also shown in FIG. 1. As shown in the 3×3 portion exploded view, the LED array 102 may include emitters 120 that each have a width $w_1$. In embodiments, the width $w_1$ may be approximately 100 μm or less (e.g., 40 μm). Lanes 122 between the emitters 120 may be a width, $w_2$, wide. In embodiments, the width $w_2$ may be approximately 20 μm or less (e.g., 5 μm). In some embodiments, the width $w_2$ may be as small as 1 μm. The lanes 122 may provide an air gap between adjacent emitters or may contain other material. A distance $d_1$ from the center of one emitter 120 to the center of an adjacent emitter 120 may be approximately 120 μm or less (e.g., 45 μm). It will be understood that the widths and distances provided herein are examples only and that actual widths and/or dimensions may vary.

It will be understood that, although rectangular emitters arranged in a symmetric matrix are shown in FIG. 1, emitters of any shape and arrangement may be applied to the embodiments described herein. For example, the LED array 102 of FIG. 1 may include over 20,000 emitters in any applicable arrangement, such as a 200×100 matrix, a symmetric matrix, a non-symmetric matrix, or the like. It will also be understood that multiple sets of emitters, matrixes, and/or boards may be arranged in any applicable format to implement the embodiments described herein.

As mentioned above, LED arrays, such as the LED array 102, may include up to 20,000 or more emitters. Such arrays may have a surface area of 90 $mm^2$ or greater and may require significant power to power them, such as 60 watts or more. An LED array such as this may be referred to as a micro LED array or simply a micro LED. In some embodiments, micro LEDs may include hundreds, thousands or even millions of LEDs or emitters positioned together on centimeter scale area substrates or smaller. A micro LED may include an array of individual emitters provided on a substrate or may be a single silicon wafer or die partially or fully divided into segments that form the emitters.

A controller may be coupled to selectively power subgroups of emitters in an LED array to provide different light beam patterns. At least some of the emitters in the LED array may be individually controlled through connected electrical traces. In other embodiments, groups or subgroups of emitters may be controlled together. In some embodiments, the emitters may have distinct non-white colors. For example, at least four of the emitters may be RGBY groupings of emitters.

LED array luminaires may include light fixtures, which may be programmed to project different lighting patterns based on selective emitter activation and intensity control. Such luminaires may deliver multiple controllable beam patterns from a single lighting device using no moving parts. Typically, this is done by adjusting the brightness of individual LEDs in a 1D or 2D array. Optics, whether shared or individual, may optionally direct the light onto specific target areas. In some embodiments, the height of the LEDs, their supporting substrate and electrical traces, and associated micro-optics may be less than 5 millimeters.

LED arrays, including LED or μLED arrays, may be used to selectively and adaptively illuminate buildings or areas for improved visual display or to reduce lighting costs. In addition, such LED arrays may be used to project media facades for decorative motion or video effects. In conjunction with tracking sensors and/or cameras, selective illumination of areas around pedestrians may be possible. Spectrally distinct emitters may be used to adjust the color temperature of lighting, as well as support wavelength specific horticultural illumination.

Street lighting is an important application that may greatly benefit from use of LED arrays. A single type of LED array may be used to mimic various street light types, allowing, for example, switching between a Type I linear street light and a Type IV semicircular street light by appropriate activation or deactivation of selected emitters. In addition, street lighting costs may be lowered by adjusting light beam intensity or distribution according to environmental conditions or time of use. For example, light intensity and area of distribution may be reduced when pedestrians are not present. If emitters are spectrally distinct, the color temperature of the light may be adjusted according to respective daylight, twilight, or night conditions.

LED arrays are also well suited for supporting applications requiring direct or projected displays. For example, warning, emergency, or informational signs may all be displayed or projected using LED arrays. This allows, for example, color changing or flashing exit signs to be projected. If an LED array includes a large number of emitters, textual or numerical information may be presented. Directional arrows or similar indicators may also be provided.

Vehicle headlamps are an LED array application that may require a large number of pixels and a high data refresh rate. Automotive headlights that actively illuminate only selected sections of a roadway may be used to reduce problems associated with glare or dazzling of oncoming drivers. Using infrared cameras as sensors, LED arrays may activate only those emitters needed to illuminate the roadway while deactivating emitters that may dazzle pedestrians or drivers of oncoming vehicles. In addition, off-road pedestrians, animals, or signs may be selectively illuminated to improve driver environmental awareness. If emitters are spectrally distinct, the color temperature of the light may be adjusted according to respective daylight, twilight, or night conditions. Some emitters may be used for optical wireless vehicle to vehicle communication.

To individually drive or control the individual LEDs or emitters in the array, a silicon backplane may be provided in close proximity to the LED array. In some embodiments, the silicon backplane may include circuitry to receive power from one or more sources to power various portions of the silicon backplane, circuitry to receive image input from one or more sources for displaying an image via the LED array, circuitry for communications between the silicon backplane and external controllers (e.g., vehicle headlamp controls, general lighting controls, etc.), circuitry for generating a signal, such as a pulse width modulated (PWM) signal, for controlling operation of the individual LEDs or emitters in the array based on, for example, received image input and communications received from external sources and a number of LED drivers for individually driving the LEDs or emitters in the array based on the generated signal. In embodiments, the silicon backplane may be a complementary metal-oxide-semiconductor (CMOS) backplane, which may include the same number of drivers as LEDs or emitters in a corresponding LED array. In some embodiments, the silicon backplane may be an application specific integrated circuit (ASIC). In some embodiments, one driver may be provided for each group of some number of LEDs or emitters and control may be of groups of LEDs or emitters rather than individual. Each driver may be electrically coupled individually to the corresponding LED or emitter or groups of LEDs or emitters. While the silicon backplane is described above with respect to particular circuitry, one of ordinary skill in the art will understand that a silicon backplane used for driving an LED array, such as described herein, may include more, less or different components that potentially carry out different functions without departing from the embodiments described herein.

As mentioned above, the individual drivers in the silicon backplane are electrically coupled to individual LEDs or emitters or groups of LEDs or emitters in the LED array. As such, the LED array must be placed in close proximity to the silicon backplane. In embodiments, this may be accomplished by individually coupling copper pillar bumps or other connectors in an array of copper pillar bumps or connectors on a surface of the LED array to corresponding connectors on an opposing surface of the silicon backplane. A silicon backplane, such as described above, may become extremely hot during operation, particularly given its close proximity to the LED array. Accordingly, heat dissipation can be challenging for such devices. While some solutions are known for heat dissipation for semiconductor devices, such solutions often include structures that dissipate heat through the top of the device. Due to light-emission from the LED arrays, however, heat dissipation through the top of the device may not be practical or possible. Embodiments described herein provide for structures that may enable effective and efficient heat dissipation through the bottom surface of the device.

Additionally, an LED array, such as the LED array 102, and the associated silicon backplane, may require a number of passive elements, such as resistors, capacitors, and crystals, to be placed on a circuit board in close proximity to the silicon backplane. In addition to providing heat dissipation through the bottom surface of the device, embodiments described herein may also provide for an LED package that enables placement of a large number of passive components (e.g., 27 or more) on a top surface of the circuit board and in close proximity to the backplane and LED array. Further, embodiments described herein may provide for a low profile LED array package that may accommodate one or more passive elements and enable dissipation of heat generated by the silicon backplane and the LED array.

Figure 2A:
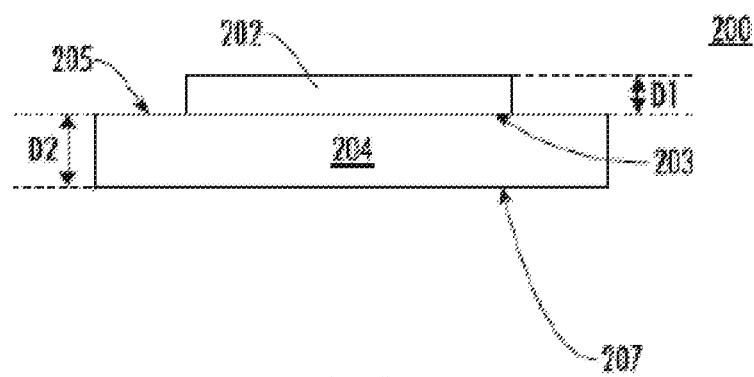
FIG. 2A is a cross-sectional view of an example hybridized device.

FIG. 2A is a cross-sectional view of an example hybridized device 200. In the example illustrated in FIG. 2A, the hybridized device 200 includes a silicon backplane 204. A first surface 203 of an LED array 202, such as a μLED, may be mounted on a first surface 205 of the silicon backplane 204. The first surface 205 of the silicon backplane 204 may also be referred to herein as a top surface, and the first surface 203 of the LED array 202 may also be referred to herein as a bottom surface, for simplicity of description. However, one of ordinary skill in the art will understand that the first surface 205 may be a bottom surface if the hybridized device 200 is turned upside, a side surface if the hybridized device 200 is turned sideways, etc. Similarly, the first surface 203 may be become a top surface if the hybridized device is turned upside down, a side surface if the hybridized device is 200 is turned sideways, etc. As mentioned above, an array of connectors (not shown) on the first surface 205 of the silicon backplane 204 may be soldered, reflowed or otherwise electrically and mechanically coupled to an array of connectors on the bottom surface of the LED array 202. The array of connectors may any array of connectors, such as an array of copper pillar bumps. The LED array 202 may have a depth D1. In embodiments, the depth D1 may be, for example, between 5 and 250 μm. The silicon backplane 204 may have a depth D2. In embodiments, the depth D2 may be, for example, between 100 μm and 1 mm. The hybridized device 200 may also be referred to as a hybridized die.

Figure 2B:
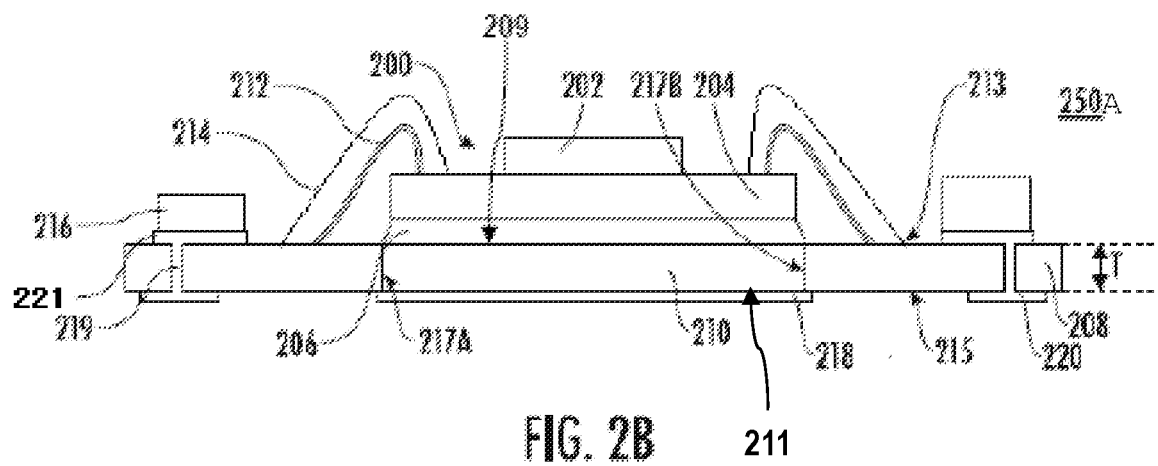
FIG. 2B is a cross-sectional view of an example LED lighting system incorporating the example hybridized device of FIG. 2A.

FIG. 2B is a cross-sectional view of an example LED lighting system 250a incorporating the example hybridized device 200 of FIG. 2A. In the example illustrated in FIG. 2B, the hybridized device 200 is packaged in a packaging substrate 208.

In the example illustrated in FIG. 2B, a second surface 207 of the silicon backplane 204 may be mounted on a first surface 209 of a metal inlay 210. The second surface 207 of the silicon backplane 204 may also be referred to herein as a bottom surface, and the first surface 209 of the metal inlay 210 may also be referred to herein as a top surface. However, one of ordinary skill in the art will understand that the second surface 207 may be a top surface if the hybridized device 200 is turned upside, a side surface if the hybridized device 200 is turned sideways, etc. Similarly, the first surface 209 may be become a bottom surface if the hybridized device is turned upside down, a side surface if the hybridized device is 200 is turned sideways, etc. In the example illustrated in FIG. 2A, the second surface 207 of the silicon backplane 204 and the first surface 209 of the metal inlay 210 are joined by a metal layer 206. The metal layer 206 may be any metal with good thermal properties that enables heat transfer between the silicon backplane 204 and the metal inlay 210. In embodiments, the metal layer 206 may be silver. The metal layer 206 thermally couples the silicon backplane 204 to the metal inlay 210.

The metal inlay 210 may be any one piece or multiple layers of one or more types of metal with good thermal properties. In embodiments, the metal inlay 210 is a single piece of metal, such as a copper or aluminum member or body. The metal inlay 210 may have a second surface 211 that may contact another circuit board, heat sink or other metal inlay or piece of metal, examples of which are described below, to facilitate heat transfer from the LED array 202 and the silicon backplane 204 to the circuit board, heat sink or other inlay or piece of metal via the metal inlay 210. The second surface 211 of the metal inlay 210 may also be referred to herein as a bottom surface. However, one of ordinary skill in the art will understand that the second surface 211 may be a top surface if the hybridized device 200 is turned upside, a side surface if the hybridized device 200 is turned sideways, etc. The metal inlay 210 may also include side surfaces. Depending on the shape, the metal inlay 210 may have any number of side surfaces or a single side surface, which may be a top surface, bottom surface, etc. depending on orientation of the hybridized device 200. One or more conductive pads may be a part of or coupled to the first and/or second surface 209/211 of the metal inlay 210 and may cover part of the first and/or second surface 209/211, all of the first and/or second surface 209/211 or extend beyond the first and/or second surface 209/211.

The metal inlay 210 may be embedded in the substrate 208 such that the metal layer 206, the silicon backplane 204 and the LED array 202 protrude and extend above a first surface 213 of the substrate 208. The first surface 213 may also be referred to herein as a top surface, but may be a side surface or bottom surface depending on orientation of the LED lighting system 250a. In some embodiments, all or portions of the metal layer 206 and/or silicon backplane 204 may be embedded in the substrate 208. The substrate 2108 may have an opening that exposes inner surfaces 217a, 217b of the substrate 208. The opening may extend completely through an entire thickness, T, of the substrate 208. Depending on the shape, the opening may have any number of inner surfaces or a single inner surface 217, which may be a top surface, bottom surface, etc. depending on orientation of the LED lighting system 250a. In the example illustrated in FIG. 2B, the hybridized device 200 is placed with at least the metal inlay 210 in the opening and the side surfaces contacting the inner surfaces 217a, 217b of the substrate 208. In such embodiments, the hybridized device 200 may be secured to the inner surfaces 217a, 217b of the substrate 208 via a suitable adhesive. In other embodiments, the substrate 208 may be molded around the hybridized device 200 such that the side surfaces of at least the metal inlay 210 are in direct contact with the inner surfaces 217a, 217b of the substrate 208. In other embodiments, the opening may be wider than the hybridized device 200 and may leave a space between the inner surfaces 217a, 217b and the side surfaces of at least the metal inlay 210.

The illustrated LED lighting system 250a may also include a metal pad 218 thermally coupled to the second surface 211 of the metal inlay 210. The metal pad 218 may facilitate connection between the metal inlay 210 and another circuit board, another metal inlay and/or a heat sink. In embodiments, the metal pad 218 may not be included, and the metal inlay 210 may be placed in direct contact with another circuit board, another metal inlay and/or a heat sink. In the illustrated embodiment, the metal pad 218 completely covers the second surface 211 of the metal inlay 210 and overlaps a portion of a second surface 215 of the substrate 208. The second surface 211 may also be referred to as a bottom surface, but may be a top surface, side surfaces, etc. depending on orientation of the LED lighting system 250. One of ordinary skill in the art will understand that the metal pad 218 may only partially cover the second surface 211 of the metal inlay 210, may completely cover the second surface 211 of the metal inlay 210 without overlapping the second surface 215 of the substrate or may extend further to cover a larger area of the second surface 215 of the substrate 208.

Passive components 216 may be mounted on the first surface 213 of the substrate 208. In the example illustrated in FIG. 2B, the passive components 216 are mounted on metal pads 221 on the first surface 213. Bottom metal pads or contacts 220 may also be provided on the second surface 215 of the substrate 208. Each of the passive components 216 may be coupled to a respective metal pad or contact 220 on the second surface 215 of the substrate 208 by a respective via 219. The vias 219 may be lined, filled or may otherwise include a metal material electrically coupled between the passive components 216 and the metal pads or contacts 220 to make an electrical connection between the passive components 216 and the metal pads or contacts 220 on the bottom surface of the substrate 208 for electrical connection to another circuit board (shown in FIG. 3). The silicon backplane 204 may also be electrically coupled to the passive components 216 via conductive connectors 212. Although not shown in FIG. 2B, metallizations on the first surface 213 of the substrate 208 may complete the electrical connection between the conductive connectors 212 and respective passive components 216. Examples of the metallizations are shown and described below with respect to FIG. 4.

Although only two conductive connectors 212 are shown in FIG. 2B, any number of conductive connectors 212 may be included. For example, the LED lighting system 250a may include 27 or more passive components 216 and an equal number of conductive connectors 212. In the illustrated embodiment, the conductive connectors 212 are wires, such as ribbon wires. However, the conductive connectors 212 may be any suitable type of conductive connector, such as flexible circuit. The conductive connectors may be completely covered by an encapsulant material 214. The encapsulant material 214 may protect the conductive connectors 212 and, in embodiments, may also serve the function of providing contrast, for example for an image displayed via the LED array 202. In embodiments, the encapsulant may be an epoxy or silicone material that has a carbon filler that may create a dark or black appearance. The encapsulant material may also be referred to herein as a light-blocking encapsulant.

Figure 2C:
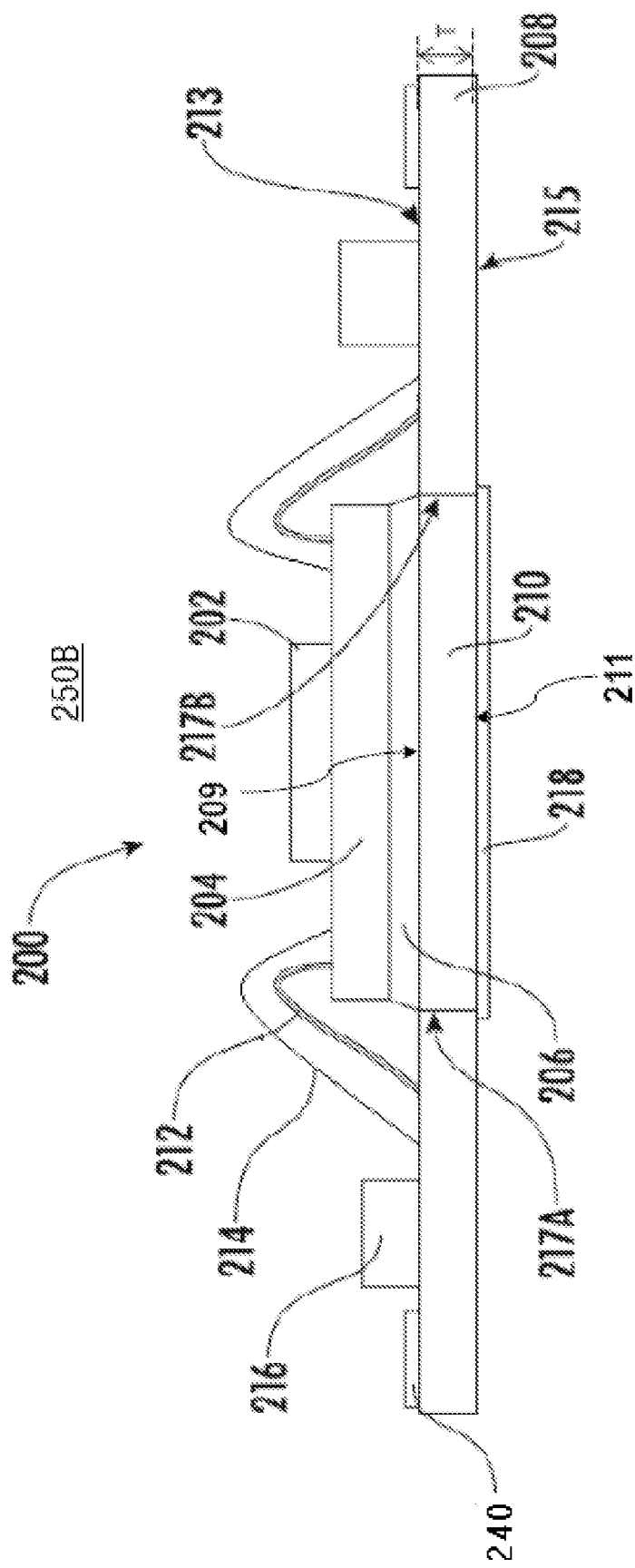
FIG. 2C is a cross-sectional view of another example LED lighting system incorporating the example hybridized device of FIG. 2A.

FIG. 2C is a cross-sectional view of another example LED lighting system 250b incorporating the example hybridized device of FIG. 2A. In the example illustrated in FIG. 2C, the hybridized device 200 is embedded in a substrate 208. More specifically, in the illustrated embodiment, the metal inlay 210 is embedded in the substrate 208 such that the metal layer 206, the silicon backplane 204 and the LED array 202 protrude and extend above a first surface 213 of the substrate 208. The first surface 213 may also be referred to herein as a top surface, but may be a side surface or bottom surface depending on orientation of the LED lighting system 250b. In some embodiments, all or portions of the metal layer 206 and/or silicon backplane 204 may be embedded in the substrate 208. The substrate 208 may have an opening that exposes inner surfaces 217a, 217b of the substrate 208. The opening may extend completely through an entire thickness, T, of the substrate 208. Depending on the shape, the opening may have any number of inner surfaces or a single inner surface 217, which may be a top surface, bottom surface, etc. depending on orientation of the LED lighting system 250. In the example illustrated in FIG. 2B, the hybridized device 200 is placed with at least the metal inlay 210 in the opening and the side surfaces contacting the inner surfaces 217a, 217b of the substrate 208. In such embodiments, the hybridized device 200 may be secured to the inner surfaces 217a, 217b of the substrate 208 via a suitable adhesive. In other embodiments, the substrate 208 may be molded around the hybridized device 200 such that the side surfaces of at least the metal inlay 210 are in direct contact with the inner surfaces 217a, 217b of the substrate 208. In other embodiments, the opening may be wider than the hybridized device 200 and may leave a space between the inner surfaces 217a, 217b and the side surfaces of at least the metal inlay 210.

The illustrated LED lighting system 250b may also include a metal pad 218 thermally coupled to the second surface 211 of the metal inlay 210, which may be a part of or separate and attached to the metal inlay 210. The metal pad 218 may facilitate connection between the metal inlay 210 and another circuit board, another metal inlay and/or a heat sink. In embodiments, the metal pad 218 may not be included, and the metal inlay 210 may be placed in direct contact with another circuit board, another metal inlay and/or a heat sink. In the illustrated embodiment, the metal pad 218 completely covers the second surface 211 of the metal inlay 210 and overlaps a portion of a second surface 215 of the substrate 208. The second surface 211 may also be referred to as a bottom surface, but may be a top surface, side surface, etc. depending on orientation of the LED lighting system 250b. One of ordinary skill in the art will understand that the metal pad 218 may only partially cover the second surface 211 of the metal inlay 210, may completely cover the second surface 211 of the metal inlay 210 without overlapping the second surface 215 of the substrate or may extend further to cover a larger area of the second surface 215 of the substrate 208.

Passive components 216 may be mounted on the first surface 213 of the substrate 208. In the example illustrated in FIG. 2B, the passive components 216 are mounted on first metal pads (not shown) on the first surface 213. Second metal pads or contacts 240 may also be provided on the first surface 213 of the substrate 208. The silicon backplane 204 may also be electrically coupled to the passive components 216 and the second metal pads or contacts 240 via conductive connectors 212. Although not shown in FIG. 2B, additional metallizations on the first surface 213 of the substrate 208 may complete the electrical connection between the silicon backplane 204, the conductive connectors 212 and respective passive components 216. Examples of the metallizations are shown and described below with respect to FIGS. 4B and 4C. The second metal pads or contacts 240 may make an electrical connection between the silicon backplane 204 and power sources and/or other electronic components on a second substrate or circuit board (example of which are shown in FIGS. 3B and 3C).

Although only two conductive connectors 212 are shown in FIG. 2C, any number of conductive connectors 212 may be included. For example, the LED lighting system 250 may include 27 or more passive components 216 and an equal or greater number of conductive connectors 212. In the illustrated embodiment, the conductive connectors 212 are wires, such as ribbon wires. However, the conductive connectors 212 may be any suitable type of conductive connector, such as flexible circuit. The conductive connectors may be completely covered by an encapsulant material 214. The encapsulant material 214 may protect the conductive connectors 212 and, in embodiments, may also serve the function of providing contrast, for example for an image displayed via the LED array 202. In embodiments, the encapsulant may be an epoxy or silicone material that has a carbon filler that may create a dark or black appearance. The encapsulant material may also be referred to herein as a light-blocking encapsulant.

Figure 3A:
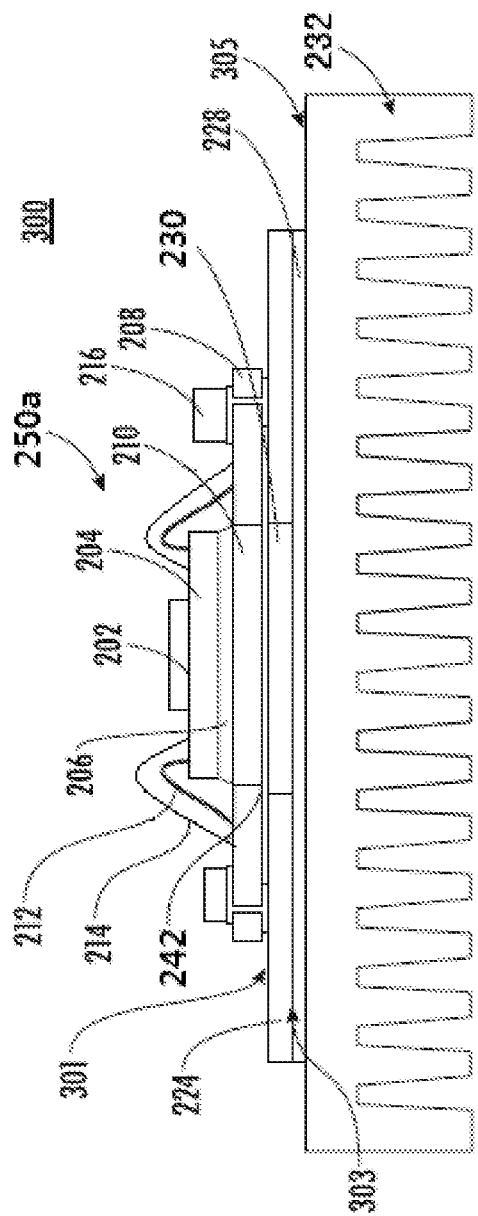
FIG. 3A is a cross-sectional view of an example application system that incorporates the LED lighting system of FIG. 2B.
Figure 3B:
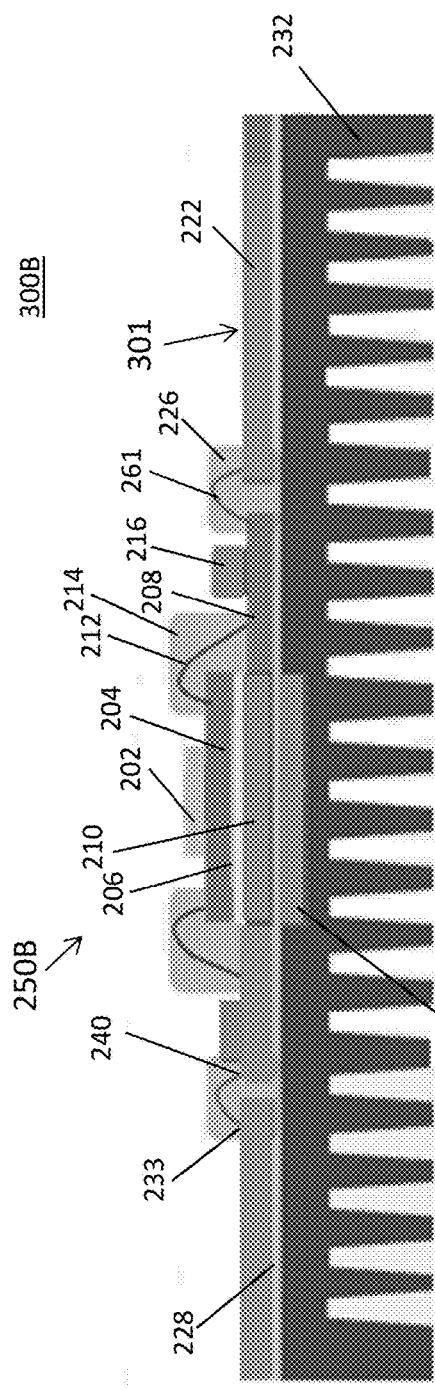
FIG. 3B is a cross-sectional view of another example application system that incorporates the LED lighting system of FIG. 2C.
Figure 3C:
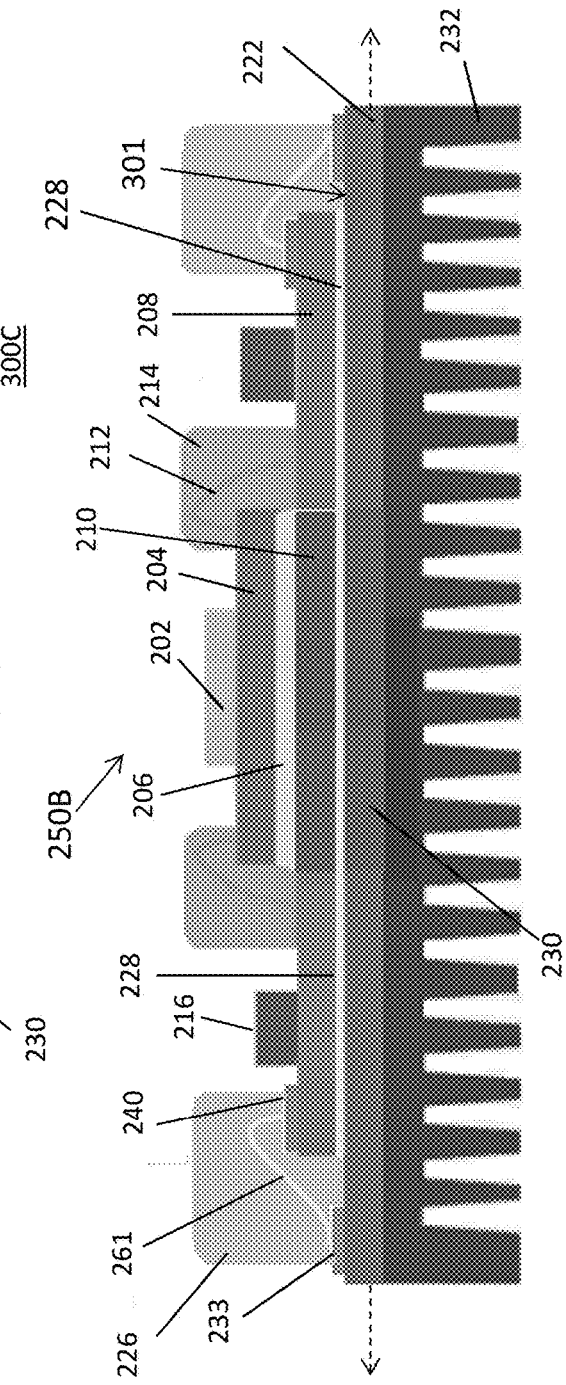
FIG. 3C is a cross-sectional view of another example application system that incorporates the LED lighting system of FIG. 2C.

FIG. 3A is a cross-sectional view of an application system 300a that incorporates the LED lighting system 250a of FIG. 2B. The application system 300a may include a circuit board 224 that has a number of metal pads (not shown) on a first surface 301. The metal pads may be in locations that correspond to locations of corresponding metal pads 218 and 220 of the LED lighting system 250a. The circuit board 224 may also include a metal inlay 230, which may include the metal pad located to correspond with the metal pad 218 of the LED lighting system 250. The metal pads 218 and 220 of the LED lighting system 250a may be soldered to the corresponding metal pads on the circuit board 224. A layer of solder 242 is shown as a uniform layer between the second surface 211 of the substrate 208 and the first surface 301 of the circuit board 224. However, in embodiments, the solder 242 will only be located between corresponding metal pads and/or extending slightly over the metal pads or not entirely cover the metal pads. The placement of the metal inlay 210 of the LED lighting system 250a in close proximity to and in thermal coupling with the circuit board 224, and in particular in close proximity to and thermal coupling with a metal inlay 230 in the circuit board 224 where included, may enable good heat transfer from the hybridized device 200 to the circuit board 224 via the second or bottom surfaces 203, 207 and 211 of the LED array 202, the silicon backplane 204 and the metal inlay 210. The first surface 301 of the substrate 224 may also be referred to herein as a top surface, but may be a bottom surface, side surfaces, etc. depending on orientation of the application system 300a.

Additionally, the electrical coupling between the metal pads 220 and corresponding metal pads on the circuit board 224 may enable electrical coupling between the passive components 216, the silicon backplane 204 and the circuit board 224. The circuit board 224 may be part of a larger system used in specific applications, such as vehicle lighting or flash applications (example vehicle lighting systems are described below with respect to FIGS. 7 and 8). The circuit board 224 may include other circuit elements required for the larger system in addition to the heat sink 232.

In embodiments, the metal inlay 230 may be located in the circuit board 224 in any of the ways mentioned above with respect to the metal inlay 210 of the LED lighting system 250a. Further, the circuit board 224 may be thermally coupled to a heat sink 232 for further heat dissipation. A second surface 303 of the circuit board 224 may be attached to a first surface 305 of the heat sink 232 via a thermal interface material (TIM). The second surface 303 may also be referred to herein as a bottom surface, and the first surface 305 may be referred to herein as a top surface, although they may each be bottom, top, side surfaces, etc. depending on orientation of the application system 300a.

FIG. 3B is a cross-sectional view of an application system 300b that incorporates the LED lighting system 250b of FIG. 2C. The application system 300b may include a circuit board 222 that has a number of metal pads 233 on a first surface 301. The metal pads 233 may be in locations that enable electrical coupling with the first metal pads or contacts 240 on the first surface 213 of the substrate 208. As illustrated in FIG. 3B, the circuit board 222 defines an opening, and the LED lighting system 250b is disposed in the opening with a gap between outer edges of the substrate 222 and inner surfaces of the circuit board 222 exposed by the opening. In embodiments, however, the gap may be smaller, larger, or non-existent.

In the example illustrated in FIG. 3B, both the substrate 208 and the circuit board 222 are on top of a heat sink 232 and thermally coupled to the heat sink 232 via a thermal interface material (TIM) 228. The second metal pads or contacts 240 may be electrically coupled to the metal pads 233 on the first surface 301 of the circuit board 222 via conductive connectors 261. In the illustrated embodiment, the conductive connectors 261 are wires, such as ribbon wires. However, the conductive connectors 261 may be any suitable type of conductive connector, such as flexible circuit. The conductive connectors 261 may be completely covered by an encapsulant material 226. The encapsulant material 226 may protect the conductive connectors 212 and, in embodiments, may also serve the function of providing contrast, for example for an image displayed via the LED array 202. In embodiments, the encapsulant 226 may be an epoxy or silicone material that has a carbon filler that may create a dark or black appearance. The encapsulant material may also be referred to herein as a light-blocking encapsulant.

The heat sink 232 may also include a metal inlay 230, which may include a metal pad located to correspond with the metal pad 218 of the LED lighting system 250b. The placement of the metal inlay 210 of the LED lighting system 250b in close proximity to and in thermal coupling with the heat sink 232, and in particular in close proximity to and thermal coupling with a metal inlay 230 in the heat sink 232, where included, may enable good heat transfer from the hybridized device 200 to the heat sink 232 via the second or bottom surfaces 203, 207 and 211 of the LED array 202, the silicon backplane 204 and the metal inlay 210.

Additionally, the electrical coupling between the metal contacts or pads 240 and corresponding metal pads on the circuit board 222 may enable electrical coupling between the passive components 216, the silicon backplane 204 and the circuit board 222. The circuit board 222 may be part of a larger system used in specific applications, such as vehicle lighting or flash applications (example vehicle lighting systems are described below with respect to FIGS. 5 and 6). The circuit board 222 may include other circuit elements required for the larger system in addition to the heat sink 232. In embodiments, the metal inlay 230 may be located in the heat sink 232 in any of the ways mentioned above with respect to the metal inlay 210 of the LED lighting system 250b.

FIG. 3C is a cross-sectional view of another application system 300c that incorporates the LED lighting system 250b of FIG. 2B. As in the application system 300b, the application system 300c may include a circuit board 222 that has a number of metal pads 233 on a first surface 301. The metal pads 233 may be in locations that enable electrical coupling with the first metal pads or contacts 240 on the first surface 213 of the substrate 208. As opposed to FIG. 3B, however, in which the LED lighting system 250b is disposed in an opening in the circuit board 222, in the application system illustrated in FIG. 3C, the LED lighting system 250b is mounted on top of the circuit board 222. In the example illustrated in FIG. 3C, the LED lighting system 250 is disposed over the circuit board 222 and thermally coupled thereto via a thermal interface material (TIM) 228.

In some embodiments, the circuit board 222 defines an opening, and a second metal inlay 230 is embedded in the opening. In embodiments, the second metal inlay 230 may be located in the circuit board 222 in any of the ways mentioned above with respect to the metal inlay 210 of the LED lighting system 250b. The LED lighting system 250b is mounted on the circuit board 222 with the metal inlays 210 and 230 aligned. The placement of the metal inlay 210 of the LED lighting system 250b in close proximity to and in thermal coupling with the circuit board 222, and in particular in close proximity to and thermal coupling with a metal inlay 230 in the circuit board 222, where included, may enable good heat transfer from the hybridized device 200 to the circuit board 222 via the second or bottom surfaces 203, 207 and 211 of the LED array 202, the silicon backplane 204 and the metal inlay 210.

In the example illustrated in FIG. 3C, the circuit board 222 is further mounted on top of a heat sink 232. The second metal pads or contacts 240 may be electrically coupled to the metal pads 233 on the first surface 301 of the circuit board 222 via conductive connectors 261. In the illustrated embodiment, the conductive connectors 261 are wires, such as ribbon wires. However, the conductive connectors 261 may be any suitable type of conductive connector, such as flexible circuit. The conductive connectors 261 may be completely covered by an encapsulant material 226. The encapsulant material 226 may protect the conductive connectors 261 and, in embodiments, may also serve the function of providing contrast, for example for an image displayed via the LED array 202. In embodiments, the encapsulant 226 may be an epoxy or silicone material that has a carbon filler that may create a dark or black appearance. The encapsulant material may also be referred to herein as a light-blocking encapsulant.

Additionally, the electrical coupling between the metal contacts or pads 240 and corresponding metal pads 233 on the circuit board 222 may enable electrical coupling between the passive components 216, the silicon backplane 204 and the circuit board 222. The circuit board 222 may be part of a larger system used in specific applications, such as vehicle lighting or flash applications (example vehicle lighting systems are described below with respect to FIGS. 5 and 6). The circuit board 222 may include other circuit elements required for the larger system in addition to the heat sink 232.

In the embodiments in both of FIGS. 3B and 3C, top surface contacts are used to make the electrical connection between the LED lighting system 250b and the circuit board 222. This may be an inexpensive way of making the connection and may also enable use of a larger board to house the passive electronic components, surface metallizations, conductive connectors and any other required or desired elements. FIGS. 3B and 3C are not shown to scale and the arrows in FIG. 3C denote that the circuit board 222 is drawn smaller than it may actually be and may be much larger than shown in the illustration.

Figure 4A:
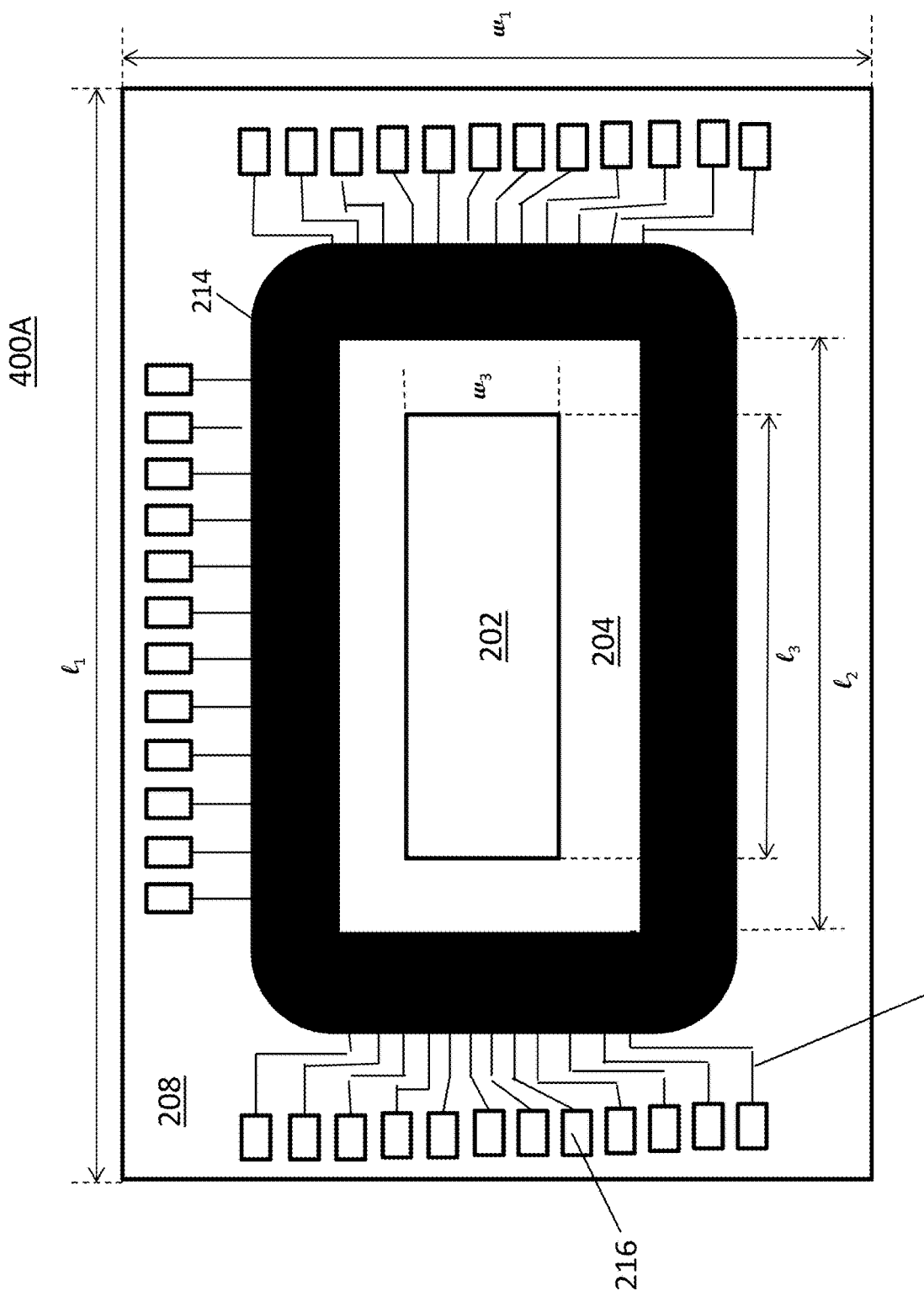
FIG. 4A is a top view of the example LED lighting system of FIG. 2B.

FIG. 4A is a top view showing a top surface 400a of the LED lighting system 250a of FIG. 2B. The top view shows a first or top surface of the LED array 202, a portion of the first or top surface 205 of the silicon backplane 204 that is not covered by the LED array 202, the encapsulant 214 covering the conductive connectors 212, the passive electronic components 216, metallizations 252 that electrically couple the conductive connectors 212 to respective ones of the passive electronic components 216, and portions of the first or top surface 213 of the substrate 208 that are not covered by the silicon backplane 204, the encapsulant 214, the metallizations 252 and the passive electronic components 216. While not shown in FIG. 4A, the conductive connectors 212 may be electrically coupled to metal pads on the first surface 213 of the substrate 208, and the metallizations 252 may be layers of metal that are patterned or etched to form electrical connections between the metal pads (not shown) and the passive electronic components 216.

As shown in FIG. 4A, the LED lighting system 250 has a length $l_1$ and a width $w_1$. In embodiments, the length $l_1$ may be approximately 30 mm and the width $w_1$ may be approximately 22 mm. The silicon backplane 204 may have a length $l_2$ and a width $w_2$ (not labeled for clarity). In embodiments, the length $l_2$ may be approximately 15.5 mm and the width $w_2$ may be approximately 6.5 mm. The LED array 202 may have a length $l_3$ and a width $w_3$. In embodiments, the length $l_3$ may be approximately 11 mm and the width $w_3$ may be approximately 4.4 mm.

Given these example dimensions, an LED array package may be provided that has a relatively large surface area (660 mm$^2$ in the above example) with a relatively large amount of the surface area not taken up by the LED array (which has a surface area of approximately 100 mm$^2$ in the above example). Accordingly, this design provides ample space for attachment of the passive electronic components on the LED array package.

Figure 4B:
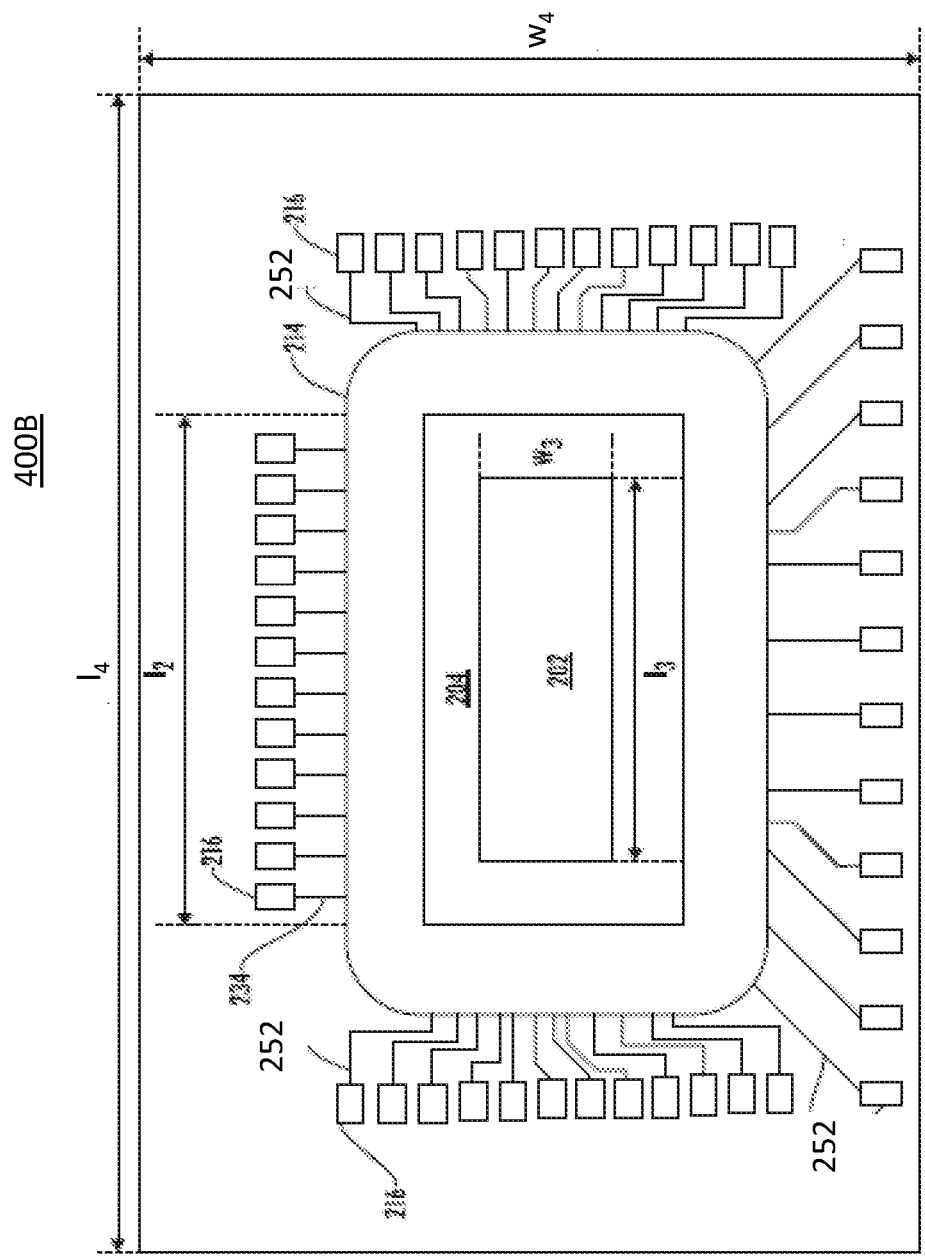
FIG. 4B is a top view of the example LED lighting system of FIG. 2C.

FIG. 4B is a top view showing a top surface 400b of the LED lighting system 250b of FIG. 2C. The top view shows a first or top surface of the LED array 202, a portion of the first or top surface 205 of the silicon backplane 204 that is not covered by the LED array 202, the encapsulant 214 covering the conductive connectors 212, the passive components 216, the first contacts or pads 240, metallizations 252 that electrically couple the conductive connectors 212 to respective ones of the passive components 216 or the first contacts or pads 240, and portions of the first or top surface 213 of the substrate 208 that are not covered by the silicon backplane 204, the encapsulant 214, the metallizations 252, the passive components 216 or the first contacts or pads 240. The metallizations 252 may be layers of metal that are patterned or etched to form electrical connections between contacts, pins or pads to which the conductive connectors (not shown) are attached and the passive components 216 or metal contacts or pads 240.

As shown in FIG. 4B, the LED lighting system 250b has a length $l_4$ and a width $w_4$. In embodiments, the length 14 may be approximately 20 mm to 40 mm and the width $w_4$ may be approximately 20 mm to 40 mm. The silicon backplane 204 may have a length $l_2$ and a width $w_2$ (not labeled for clarity). In embodiments, the length $l_2$ may be approximately 15.5 mm and the width $w_2$ may be approximately 6.5 mm. The LED array 202 may have a length $l_3$ and a width $w_3$. In embodiments, the length $l_3$ may be approximately 11 mm and the width $w_3$ may be approximately 4.4 mm.

Given these example dimensions, an LED array package may be provided that has a large surface area (400 mm$^2$ to 1600 mm$^2$ in the above example) with a large amount of the surface area not taken up by the LED array (which has a surface area of approximately 100 mm$^2$ in the above example). Accordingly, this design provides ample space for attachment of the passive electronic components on the LED array package.

Figure 4C:
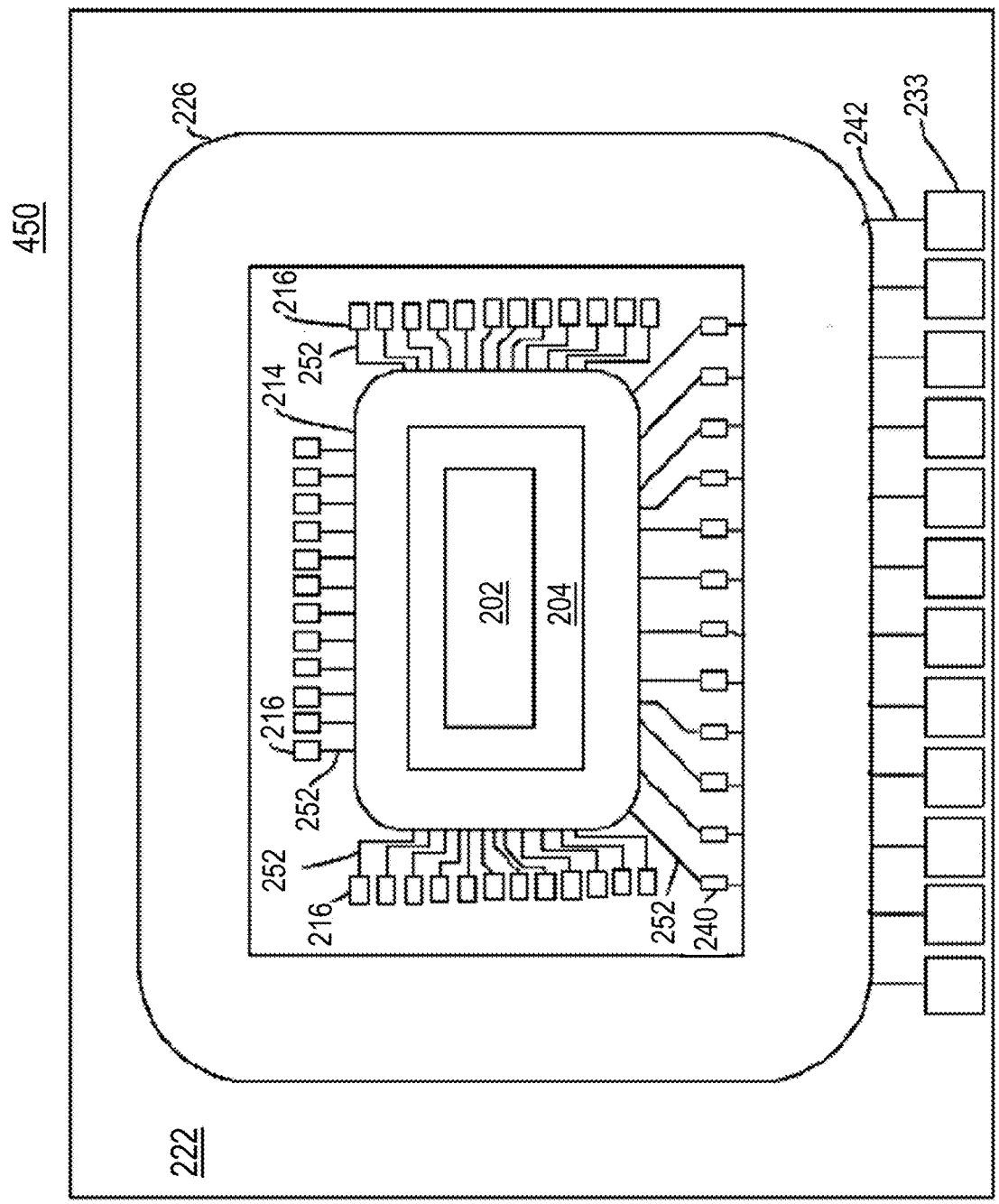
FIG. 4C is a top view of the example application system of FIG. 3B or 3C.

FIG. 4C is a top view showing a top surface 450 of the application system 300b or 300c of FIGS. 3B and 3C. In the example illustrated in FIG. 4C, the LED lighting system 250b is mounted on a top surface of the circuit board 222. The encapsulant material 226 covering the conductive connectors 261 is also shown. The contacts or pads 233 are electrically coupled to the conductive connectors 261 via metallizations 252.

While top contacts, pads, passive components, and metallizations are shown in specific locations on particular sides of the substrate 208 and circuit board 222 in FIGS. 4A, 4B and 4C, one of ordinary skill in the art will recognize that more or less of these elements may be included and may be on all sides, less sides or in different locations than shown.

As mentioned above, the silicon backplane may include circuitry to receive power from one or more sources to power various portions of the silicon backplane, circuitry to receive image input from one or more sources for displaying an image via the LED array, circuitry for communications between the silicon backplane and external controllers (e.g., vehicle headlamp controls, general lighting controls, etc.), circuitry for generating a signal, such as a pulse width modulated (PWM) signal, for controlling operation of the individual LEDs or emitters in the array based on, for example, received image input and communications received from external sources and a number of LED drivers for individually driving the LEDs or emitters in the array based on the generated signal. For the communications, the silicon backplane may have a large number of digital interfaces and, thus, may require a large number (e.g., one hundred or more) physical connection input/output (I/O) pins for connecting to either passive components on the substrate 208 or to an external circuit board, such as a control board. In some embodiments, the external board or device may be a vehicle headlamp, which may be communicatively coupled to various control modules in an automobile to receive control signals.

Additionally, the silicon backplane may require multiple external power supplies (e.g., two or more) to power the hybridized device. In embodiments, the hybridized device my include groups of I/O pins that correspond to two or more power supplies, such as a digital power supply, an analog power supply and an LED power supply. Each external power supply may require one or more passive components placed in close proximity to the corresponding I/O pins (e.g., within 10 mm of at least one of the I/O pins). In embodiments, such passive components may include at least one individual de-coupling capacitor, and sometimes five or more de-coupling capacitors. In addition, the silicon backplane may require resistors to precisely set LED current, other non-de-coupling capacitors, and/or a crystal to set a frequency for a universal asynchronous receiver-transmitter (UART). Many or all of these passive components should be placed as closely as possible to the silicon backplane pins (e.g., within 10 mm of at least one of the I/O pins). For example, the crystal used to set the frequency for the UART may have a very high frequency, which may be sensitive to noise. Additionally, each of these passive components may need to be electrically coupled to the silicon backplane. This may make space on the substrate 208 challenging.

In embodiments, passive components that need to be placed in close proximity to the I/O pins of the silicon backplane may be mounted on a top surface of the packaging substrate 208. In embodiments, all passive components that support the silicon backplane may be mounted on the packaging substrate 208 while, in other embodiments, some passive components (e.g., those that can be spaced farther away from the I/O pins of the silicon backplane) may be mounted on a separate circuit board, such as a control board. As mentioned above, the silicon backplane 204 may use conductive connectors 212, such as ribbon wires or flexible circuits, to make potentially many electrical connections between the silicon backplane 204 and the substrate 208. This saves space on the substrate 208 that can be used for the passive components themselves and for other routing, as described in more detail below. Additionally, for a micro-LED, a large current may be required, such as 17 Amps. Routing for such a large current may require large traces. To accommodate the routing and save space on the packaging substrate for the passive components, a multiple-layer board structure is described below, each of the layers having a different function. This may enable, for example, use of large traces to route the large current as well as appropriate separation of the analog and digital grounds on separate layers.

Figure 5A:
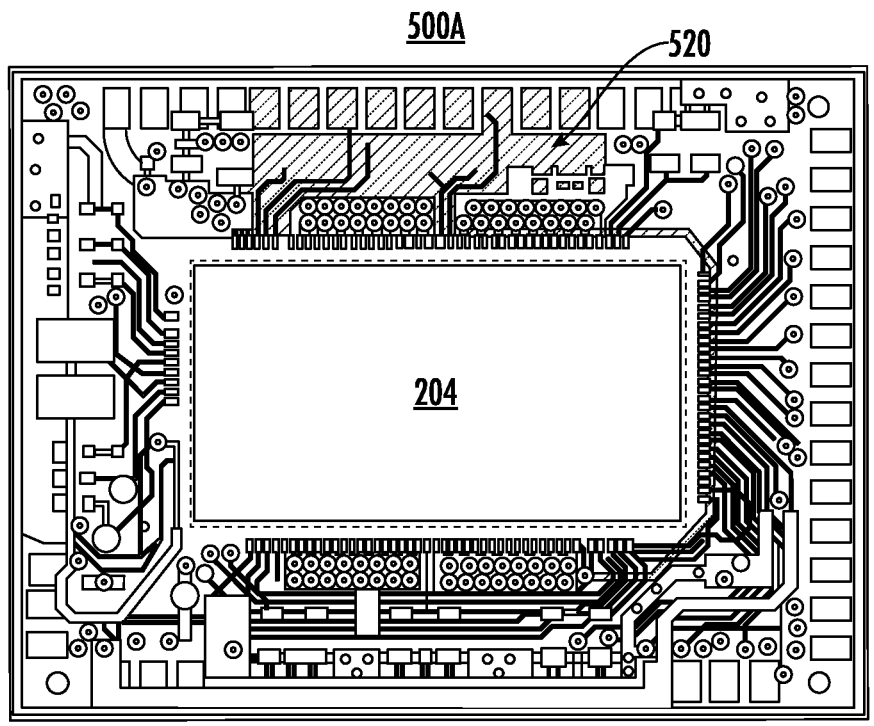
FIGS. 5A, 5B, 5C and 5D are top views of another example LED lighting system showing an example layout of passive components, metallizations and other elements.
Figure 5B:
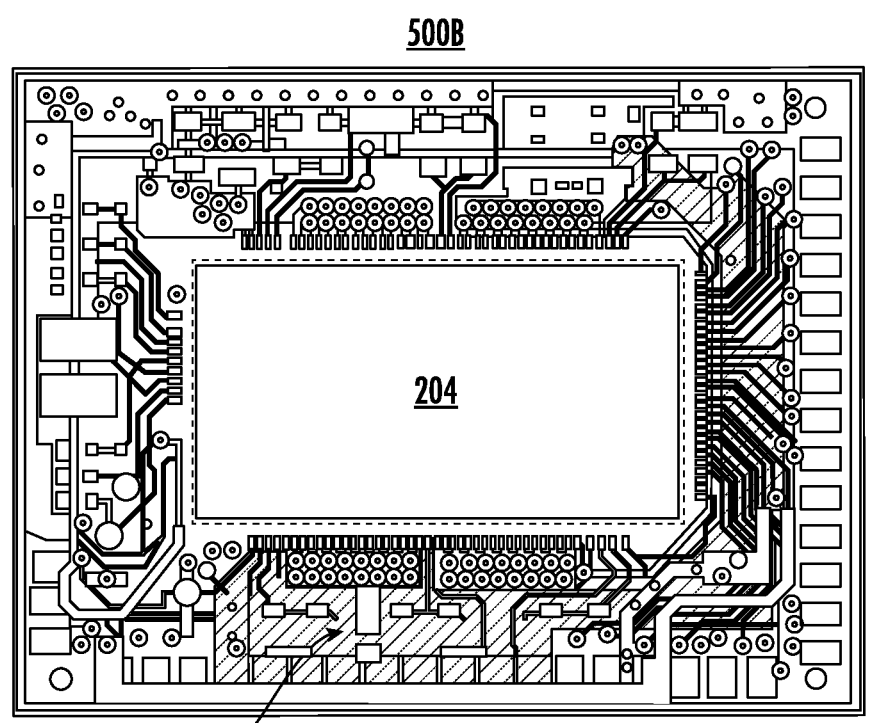
Figure 5C:
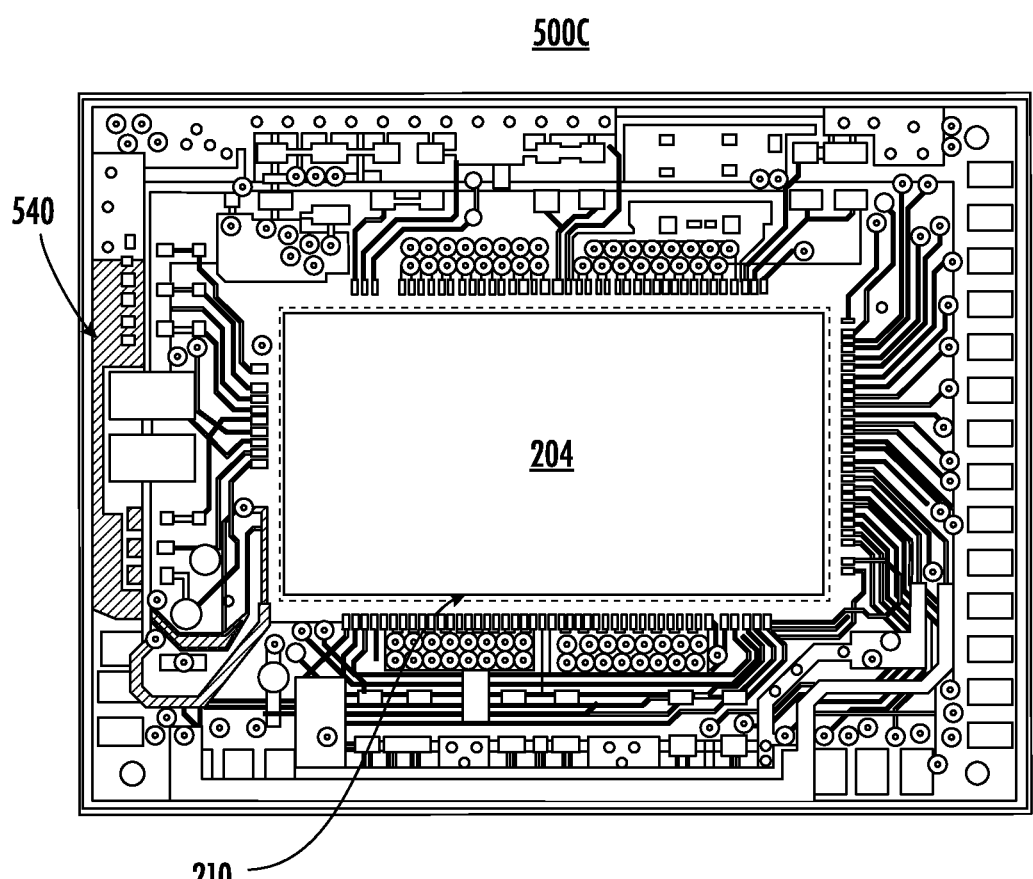
Figure 5D:
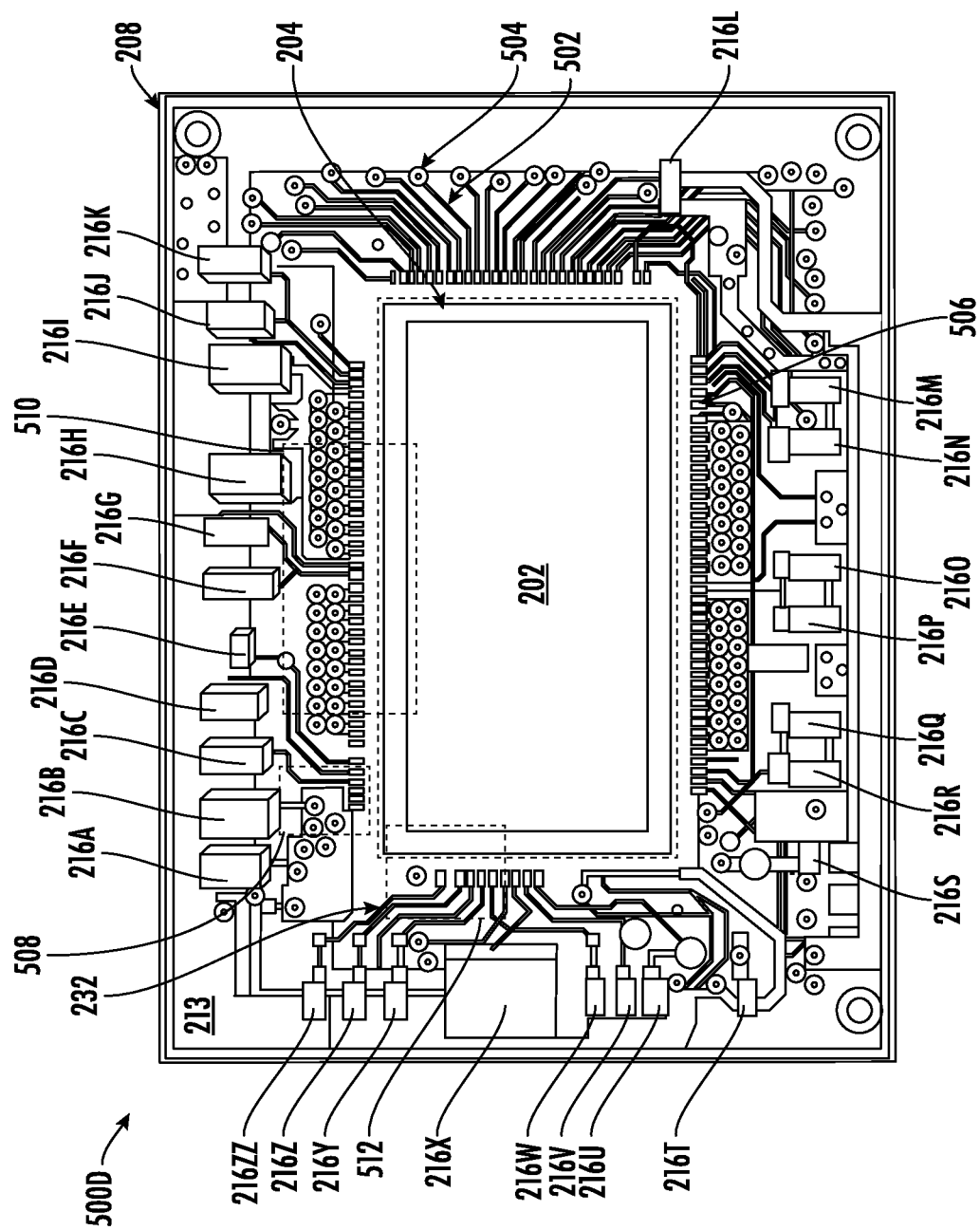

FIGS. 5A, 5B, 5C and 5D are top views 500A, 500B, 500C and 500D of another example LED lighting system showing an example layout of passive components, metallizations and other elements. FIG. 5D illustrates an example layout of the passive components 216 as well as some of the surface metallizations and through-board connections (e.g., vias).

In the example illustrated in FIG. 5D, twenty-seven passive components 216a-216zz are mounted on the first surface 213 of the substrate 208. One of ordinary skill in the art will understand, however, that more or less passive components 216 may be mounted on the substrate without deviating from the embodiments described herein. As mentioned above, for example, all of the passive components that support the silicon backplane may be placed on the first surface 213 of the substrate 208 or some of the passive components that support the silicon backplane may be placed on the first surface 213 of the substrate 208 while others may be mounted on a separate circuit board, such as a control board. The passive components may include, for example, capacitors (de-coupling or non-de-coupling), resistors and/or crystals, as mentioned above, or any other type of passive component not specifically mentioned. In a central region of the substrate 208, the LED array 202 is illustrated mounted on the silicon backplane 204.

For clarity, the conductive connectors 212 are not shown in FIG. 5D. However, the pins 506 that the conductive connectors 212 are soldered or otherwise electrically coupled to are illustrated. In other words, the pins 506 may be electrically coupled to corresponding I/O pins (not shown) of the silicon backplane 204. While the I/O pins of the silicon backplane are not shown in FIG. 5D, they may correspond to locations in FIGS. 2A-2C, for example, where the conductive connectors 212 attach to the top surface of the silicon backplane 204. As shown in FIG. 5D, the pins 506 may be routed via metallizations 252 to the passive components 216a-216zz and may also be routed to other components or layers via metallizations 502. At least some of the passive components 216a-216zz should be in close proximity to the I/O pins (not shown) of the silicon backplane 204. For example, the passive components 216a-216zz may be within 10 mm of at least one of the I/O pins of the silicon backplane 204.

In FIG. 5D, one metallization 502 is labeled and is electrically coupled to a via 504 and one metallization 232 is labeled and is electrically coupled to one of the passive components 216zz. The routing of the vias 504 are shown in each of the four layers of the example four layer circuit board structure in FIGS. 6A, 6B, 6C and 6D below. Example locations of groups of pins 506 for receiving from three example power supplies are also labeled in FIG. 5D and include, for example, a digital power supply location or group 508, an LED power supply location or group 510, and an analog power supply location or group 512 and corresponding passive components or groups of passive components (e.g., passive components 216y, 216z, 216zz, 216a, 216b, 216c, 216d, 216e, 216f, 216g and 216h, although more or less of these passive components may be used for the various power supplies). The groups of pins 506 may correspond to corresponding groups of I/O pins (not shown) on the silicon backplane.

FIGS. 5A, 5B and 5C show additional surface metallizations that may be used for routing. 5A illustrates a positive power trace 520, including corresponding metal pads. FIG. 5B illustrates a ground trace 530 for the digital ground (located on a separate layer). FIG. 5C illustrates an analog ground 540, which is separated from the digital ground, which is on a separate layer. While a specific layout is shown in FIGS. 5A, 5B, 5C and 5D, one of ordinary skill in the art will recognize that different layouts are possible consistent with the embodiments described herein.

Figure 6A:
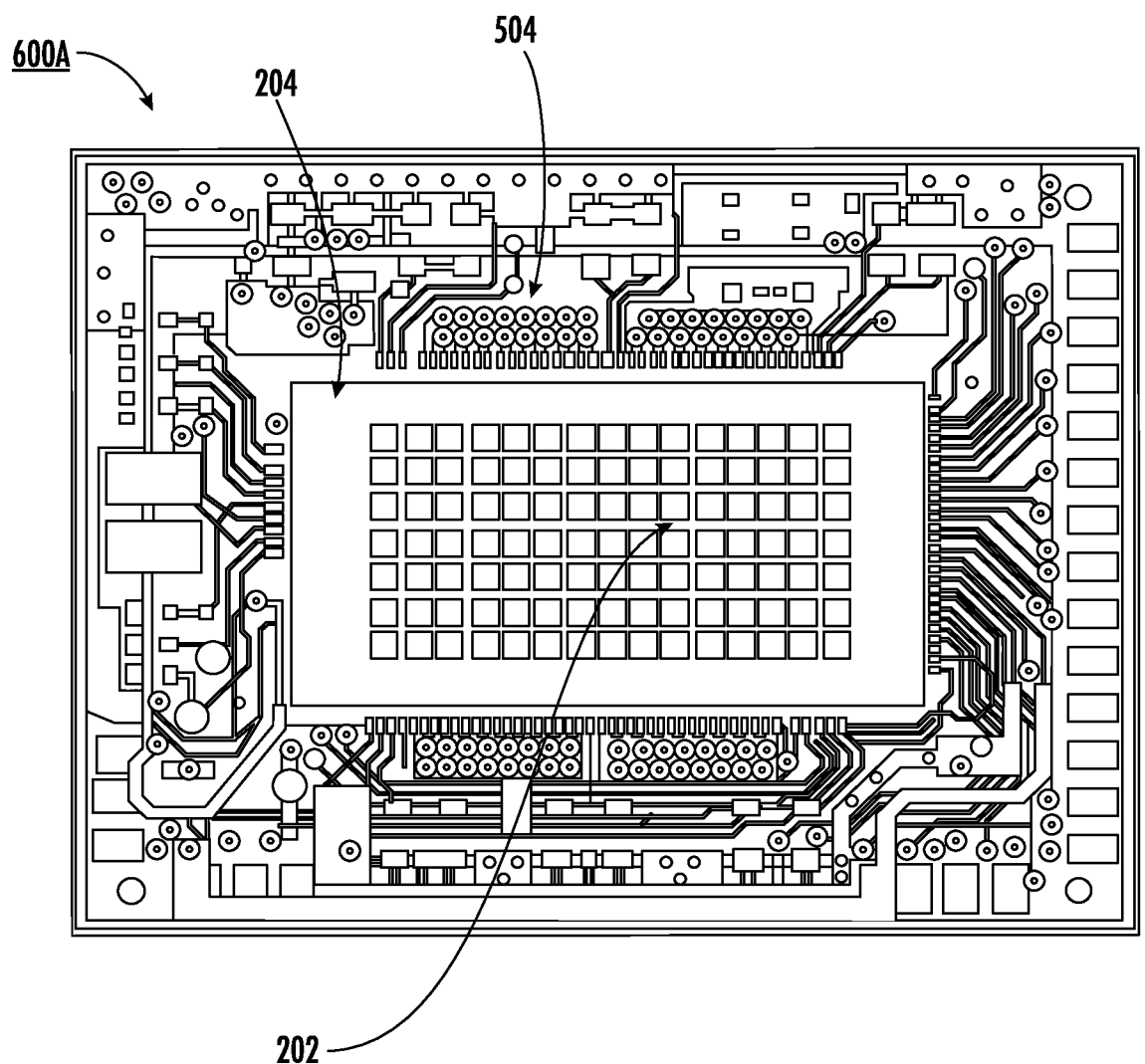
FIGS. 6A, 6B and 6C are top views of a top-most or first layer, a second layer, and a third layer of an example four-layer circuit board.
Figure 6B:
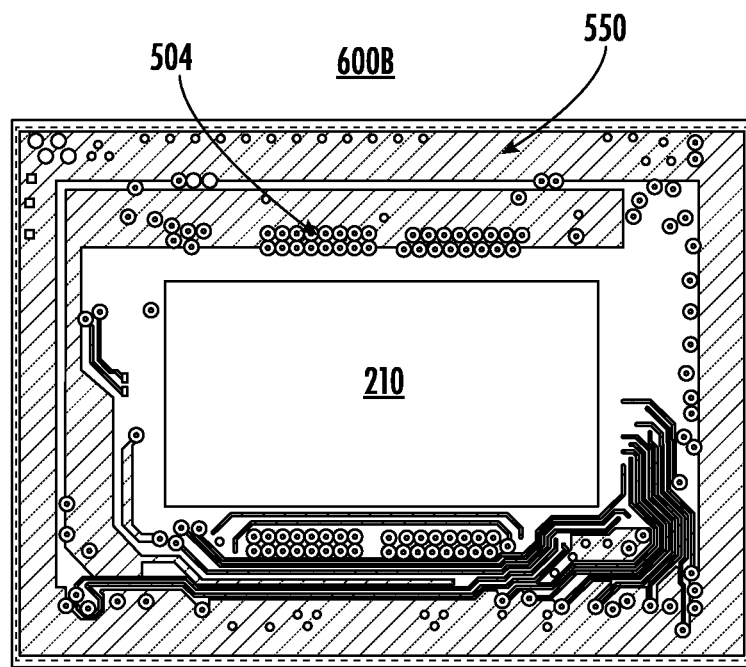
Figure 6C:
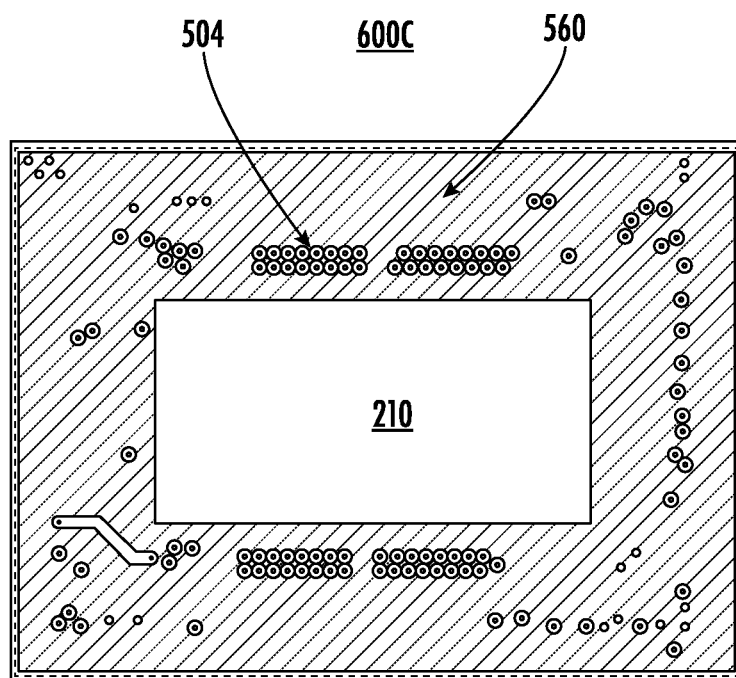
Figure 6D:
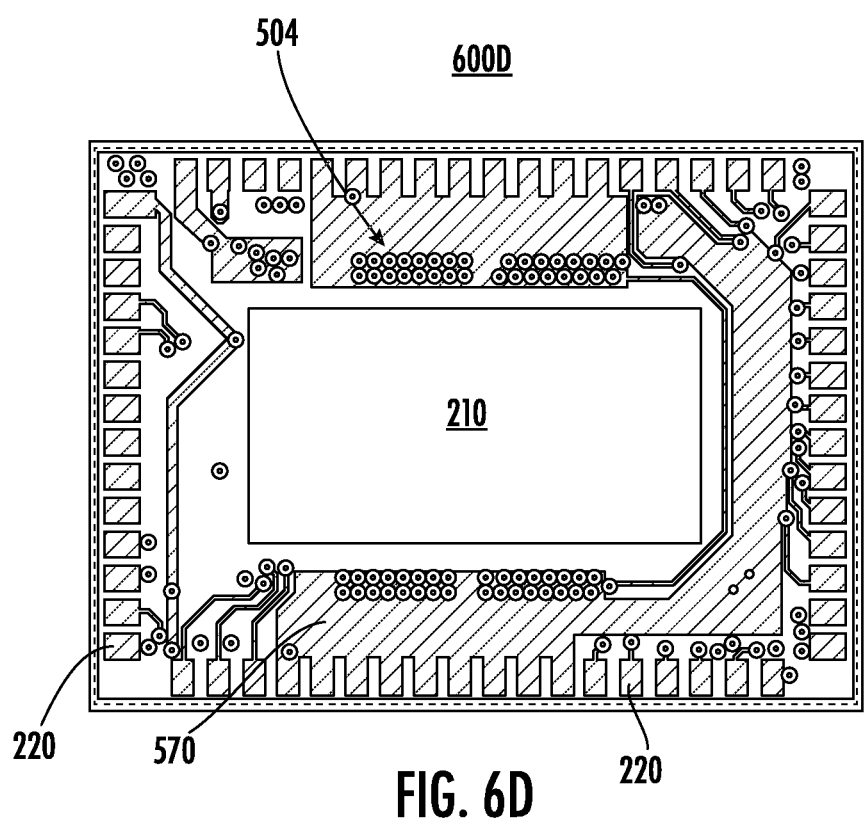
FIG. 6D is a bottom view of a bottom-most or fourth layer of the example four-layer circuit board.

FIGS. 6A, 6B and 6C are top views 600A, 600B, and 600C of a top-most or first layer, a second layer, and a third layer of an example four-layer circuit board. FIG. 6D is a bottom view 600D of a bottom-most or fourth layer of the example four-layer circuit board.

FIG. 6A is a top view 600A of a top-most or first layer of an example four-layer circuit board. The top or first layer may be similar to first surface 213 of the substrate 208 shown in FIGS. 5A, 5B, 5C and 5D. FIG. 6A, in particular, illustrates the LED array 202, the silicon backplane 204 and various surface routing. Through-board connections (e.g., vias) 504 are also labeled in FIG. 6A to show correspondence between the through board connections 504 in FIGS. 6A, 6B, 6C and 6D.

FIG. 6B is a top view 600B of a second layer of the example four-layer circuit board. As mentioned above, each layer in a multi-layer circuit board may serve a different function. In embodiments, the second layer illustrated in FIG. 6B may be for control signal routing and may include traces 550 that may carry out that function. Through-board connections 504 are also labeled. As illustrated in FIG. 6B, a portion of the metal inlay 210 may extend through the example second layer illustrated in FIG. 6B.

FIG. 6C is a top view 600C of a third layer of the example four-layer circuit board. In embodiments, the third layer may include a digital ground plane 560, which, as mentioned above, may be separated from the analog ground 540 on the top-most or first layer. The digital ground plane 560 may serve as the ground connection for digital blocks of the silicon backplane as well as EMC shielding. This may avoid ground bouncing between the analog and digital circuits that may otherwise cause electromagnetic compatibility (EMC) issues and circuit malfunctioning. Through-board connections 504 are also labeled. As illustrated in FIG. 6C, a portion of the metal inlay 210 may extend through the example second layer illustrated in FIG. 6C.

FIG. 6D is a bottom view 600D of a bottom-most or fourth layer of the example four-layer circuit board. The bottom-most or fourth layer may represent the second surface 215 of the substrate 208 of FIG. 2B. FIG. 6D also shows the second surface 211 of the metal inlay 210. Metal pad 218 may be attached to this surface of the metal inlay 210 (not shown in FIG. 6D). FIG. 6D illustrates metal traces 570, which may include the metal contacts 220 of the embodiment of FIG. 2B. These may be electrically coupled to the passive components 216 as well as potentially other traces or components on the top-most or first layer by the through-board connections 504 or potentially other vias. In embodiments, as the four layer structure includes routing through the substrate 208 to metal contacts 220 on the bottom surface of the substrate 208, the four layer circuit board may only be applicable to the embodiments where bottom contacts are used for connection to an external board, such as a control board.

While FIGS. 6A-6D specifically show a four layer circuit board, the four layer circuit board could be implemented as a multiple layer circuit board, with less or more than four layers, depending, for example, on the number of external power supplies, digital interfaces, passive components, or potentially other features, to be included.

Figure 7:
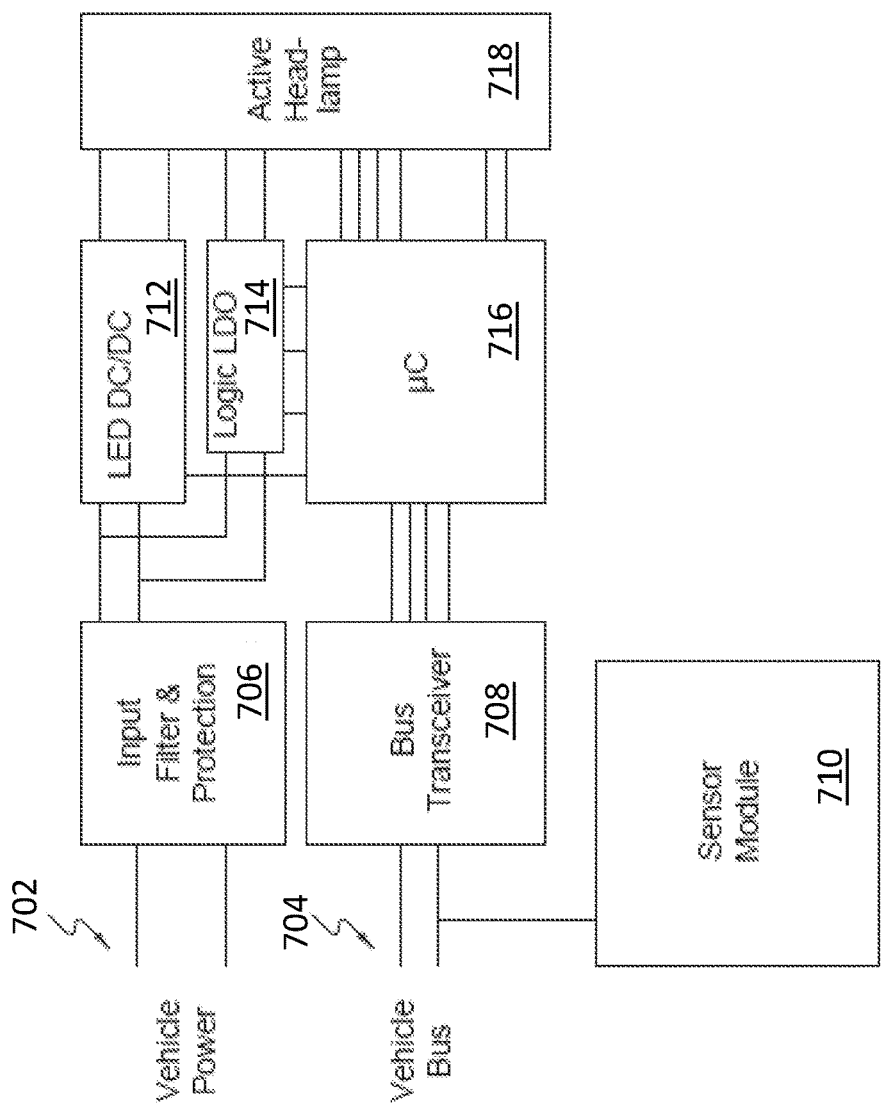
FIG. 7 is a diagram of an example vehicle headlamp system that may incorporate the LED lighting system of FIG. 2B or FIG. 2C.

FIG. 7 is a diagram of an example vehicle headlamp system 700 that may incorporate the LED lighting system 250a or 250b of FIG. 2B or 2C. The example vehicle headlamp system 700 illustrated in FIG. 7 includes power lines 702, a data bus 704, an input filter and protection module 706, a bus transceiver 708, a sensor module 710, an LED direct current to direct current (DC/DC) module 712, a logic low-dropout (LDO) module 714, a micro-controller 716 and an active head lamp 718. In embodiments, the active head lamp 718 may include an LED lighting system, such as the LED lighting system 250a or 250b of FIG. 2B or 2C.

The power lines 702 may have inputs that receive power from a vehicle, and the data bus 704 may have inputs/outputs over which data may be exchanged between the vehicle and the vehicle headlamp system 700. For example, the vehicle headlamp system 700 may receive instructions from other locations in the vehicle, such as instructions to turn on turn signaling or turn on headlamps, and may send feedback to other locations in the vehicle if desired. The sensor module 710 may be communicatively coupled to the data bus 704 and may provide additional data to the vehicle headlamp system 700 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 700. In FIG. 7, the headlamp controller may be a micro-controller, such as micro-controller (pc) 716. The micro-controller 716 may be communicatively coupled to the data bus 704.

The input filter and protection module 706 may be electrically coupled to the power lines 702 and may, for example, support various filters to reduce conducted emissions and provide power immunity. Additionally, the input filter and protection module 706 may provide electrostatic discharge (ESD) protection, load-dump protection, alternator field decay protection, and/or reverse polarity protection.

The LED DC/DC module 712 may be coupled between the filter and protection module 706 and the active headlamp 718 to receive filtered power and provide a drive current to power LEDs in the LED array in the active headlamp 718. The LED DC/DC module 712 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 714 may be coupled to the input filter and protection module 706 to receive the filtered power. The logic LDO module 714 may also be coupled to the micro-controller 716 and the active headlamp 718 to provide power to the micro-controller 716 and/or the silicon backplane (e.g., CMOS logic) in the active headlamp 718.

The bus transceiver 708 may have, for example, a universal asynchronous receiver transmitter (UART) or serial peripheral interface (SPI) and may be coupled to the micro-controller 716. The micro-controller 716 may translate vehicle input based on, or including, data from the sensor module 710. The translated vehicle input may include a video signal that is transferrable to an image buffer in the active headlamp module 718. In addition, the micro-controller 716 may load default image frames and test for open/short pixels during startup. In embodiments, an SPI interface may load an image buffer in CMOS. Image frames may be full frame, differential or partial frames. Other features of micro-controller 716 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 8:
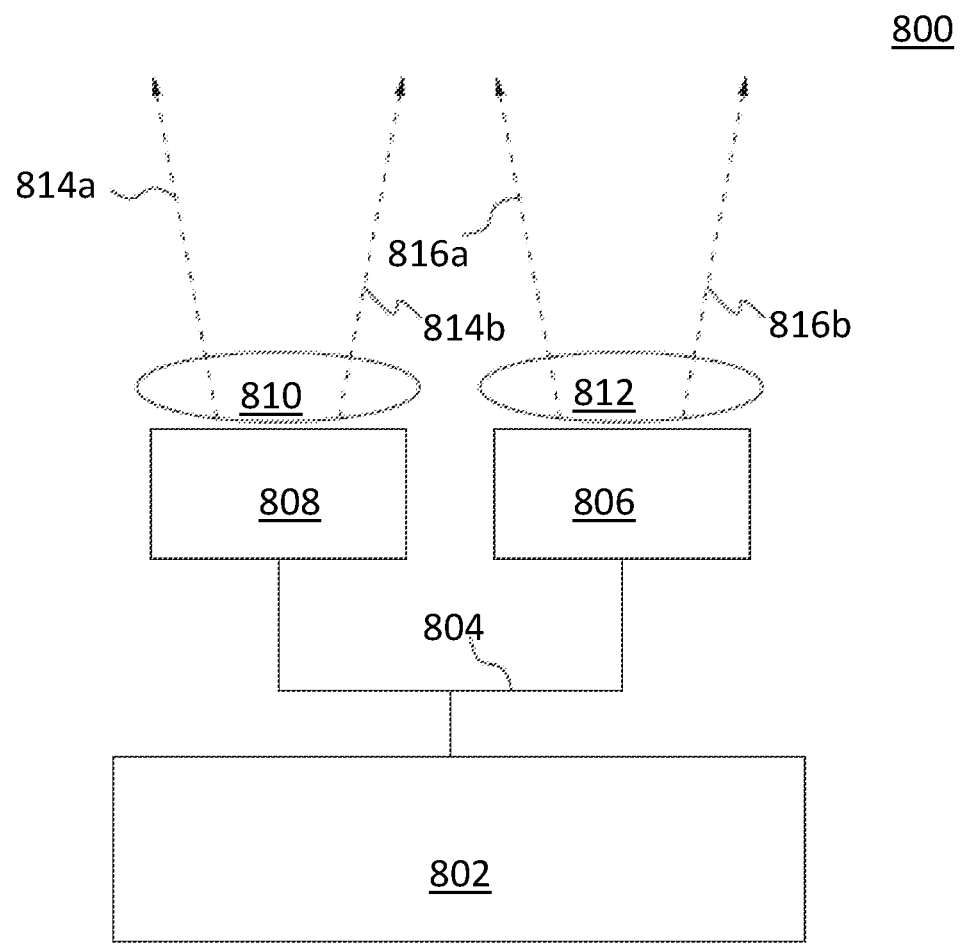
FIG. 8 is a diagram of another example vehicle headlamp system.

FIG. 8 is a diagram of another example vehicle headlamp system 800. The example vehicle headlamp system 800 illustrated in FIG. 8 includes an application platform 802, two LED lighting systems 806 and 808, and optics 810 and 812. The two LED lighting systems 806 and 808 may be LED lighting systems, such as the LED lighting system 250 of FIG. 2B, or may include the LED lighting system 250 plus some of all of the other modules in the vehicle headlamp system 700 of FIG. 7. In the latter embodiment, the LED lighting systems 806 and 808 may be vehicle headlamp sub-systems.

The LED lighting system 808 may emit light beams 814 (shown between arrows 814a and 814b in FIG. 8). The LED lighting system 806 may emit light beams 816 (shown between arrows 816a and 816b in FIG. 8). In the embodiment shown in FIG. 8, a secondary optic 810 is adjacent the LED lighting system 808, and the light emitted from the LED lighting system 808 passes through the secondary optic 810. Similarly, a secondary optic 812 is adjacent the LED lighting system 806, and the light emitted from the LED lighting system 806 passes through the secondary optic 812. In alternative embodiments, no secondary optics 810/812 are provided in the vehicle headlamp system.

Where included, the secondary optics 810/812 may be or include one or more light guides. The one or more light guides may be edge lit or may have an interior opening that defines an interior edge of the light guide. LED lighting systems 808 and 806 (or the active headlamp of a vehicle headlamp sub-system) may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 808 and 806 in a desired manner, such as, for example, with a gradient, a chamfered distribution, a narrow distribution, a wide distribution, or an angular distribution.

The application platform 802 may provide power and/or data to the LED lighting systems 806 and/or 808 via lines 804, which may include one or more or a portion of the power lines 702 and the data bus 704 of FIG. 7. One or more sensors (which may be the sensors in the example vehicle headlamp system 700 or other additional sensors) may be internal or external to the housing of the application platform 8402. Alternatively or in addition, as shown in the example vehicle headlamp system 700 of FIG. 7, each LED lighting system 808 and 806 may include its own sensor module, connectivity and control module, power module, and/or LED array.

In embodiments, the vehicle headlamp system 800 may represent an automobile with steerable light beams where LEDs may be selectively activated to provide steerable light. For example, an array of LEDs (e.g., the LED array 102) may be used to define or project a shape or pattern or illuminate only selected sections of a roadway. In an example embodiment, infrared cameras or detector pixels within LED lighting systems 806 and 808 may be sensors (e.g., similar to sensors in the sensor module 710 of FIG. 7) that identify portions of a scene (e.g., roadway or pedestrian crossing) that require illumination.

Figure 9A:
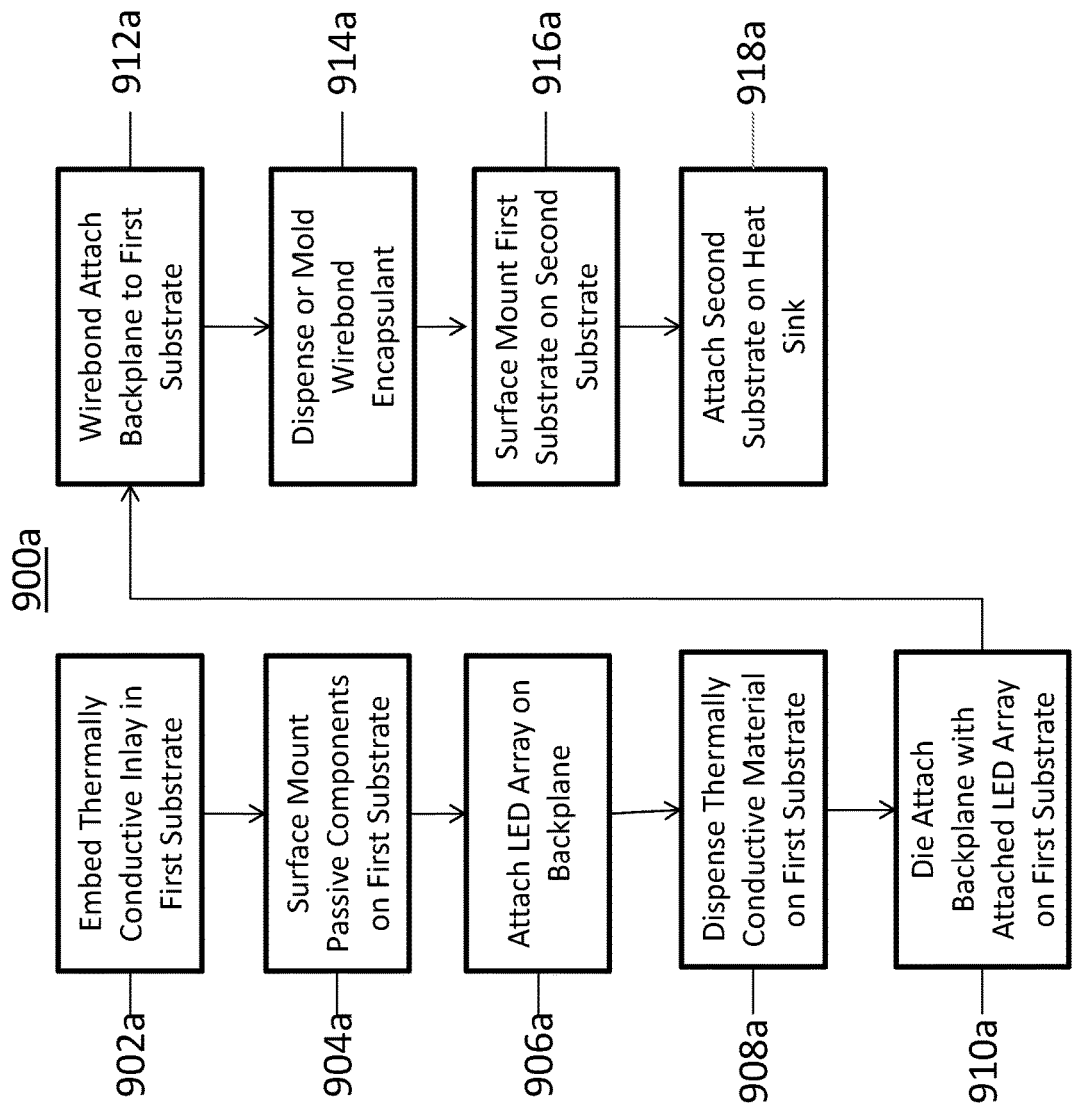
FIG. 9A is a flow diagram of an example method of manufacturing an LED lighting system, such as the LED lighting system of FIG. 2B.

FIG. 9A is a flow diagram of an example method 900a of manufacturing an LED lighting system, such as the LED lighting system 250a of FIG. 2B.

In the example method 900a of FIG. 9A, a thermally conductive inlay may be embedded in a first substrate (902a). In embodiments, this may be done by placing the thermally conductive inlay in an opening in the first substrate. In some embodiments, the thermally conductive inlay may be adhered to exposed inner side surfaces of the substrate using an adhesive or may be pressure fit. In some embodiments, the substrate may be molded around the thermally conductive inlay. Passive components may be surface mounted on the first substrate (904a). In embodiments, the passive components may be mounted, for example by soldering, on at least some of a number of metal contacts on a first or top surface of the first substrate. In embodiments, vias and other surface metallization may already be formed on the first substrate when the thermally conductive inlay is embedded or may be formed after.

An LED array, such as a micro-LED array, may be attached to a first or top surface of a silicon backplane (906a). In embodiments, the LED array may include an array of connectors, such as copper pillar bumps, and they may be individually coupled to drivers in the silicon backplane by soldering, reflow or other methods. A thermally conductive material may be dispensed on the first substrate (908a). In embodiments, the thermally conductive material may be dispensed on at least a metal pad attached to or part of the thermally conductive inlay. In other embodiments, the thermally conductive material may be dispensed directly on at least the thermally conductive inlay. In some embodiments, the thermally conductive material may cover an entirety of the first or top surface of the first substrate. In embodiments, the thermally conductive material may be silver. The backplane with the LED array attached may be die attached to the first substrate (910a), for example by placing it on the thermally conductive material and allowing it to cure.

The backplane may be wirebond attached to the first substrate (912a). This may be done, for example, using ribbon wire, flexible circuit, or other connector and soldering or otherwise electrically coupling metal contacts, pads or pins on the backplane to metal contacts, pads or pins on the first or top surface of the first substrate. An encapsulant material, such as described in detail above, may be dispensed on or molded around the wirebonds (914a) (e.g., ribbon wires, flexible circuits, or other conductive connectors). In embodiments, this may result in the wirebonds being completely covered by the encapsulant material.

The first substrate may be surface mounted on a second substrate (916a). In embodiments, metal pads or contacts on the second or bottom surface of the first substrate may be soldered or otherwise electrically coupled to metal pads or contacts on a first or top surface of the second substrate. Further, in some embodiments, a thermally conductive inlay embedded in the second substrate may be thermally coupled to the thermally conductive inlay embedded in the first substrate, for example by soldering pads on or part of both thermally conductive inlays together or directly soldering the thermally conductive inlays together. The second substrate may be attached to a first or top surface of a heat sink (918a), for example, using a thermal interface material (TIM).

Figure 9B:
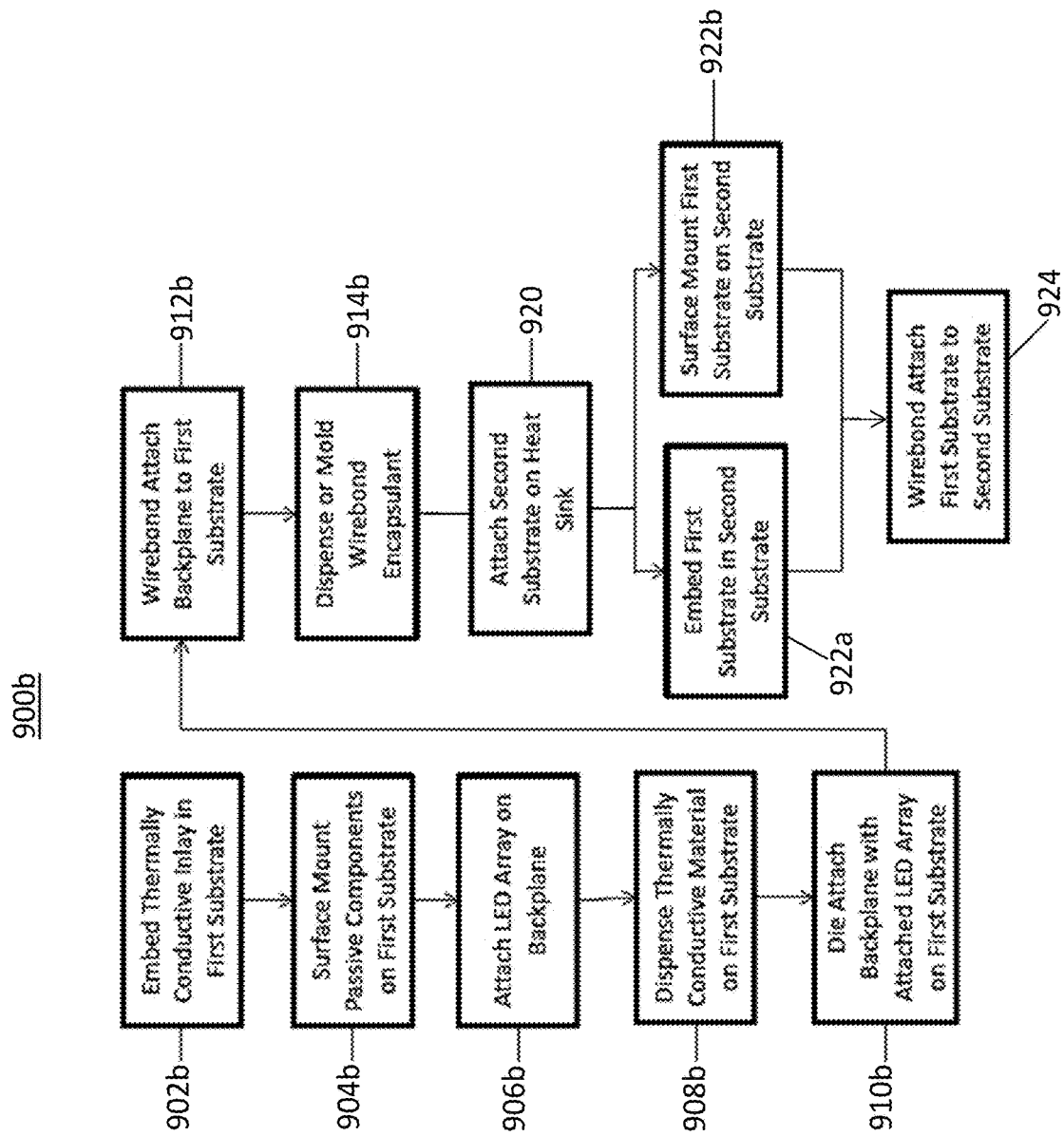
FIG. 9B is a flow diagram of an example method of manufacturing an LED lighting system, such as the LED lighting system of FIG. 2C.

FIG. 9B is a flow diagram of an example method 900b of manufacturing an LED lighting system, such as the LED lighting system 250b of FIG. 2C.

In the example method 900b of FIG. 9, a thermally conductive inlay may be embedded in a first substrate (902b). In embodiments, this may be done by placing the thermally conductive inlay in an opening in the first substrate. In some embodiments, the thermally conductive inlay may be adhered to exposed inner side surfaces of the substrate using an adhesive or may be pressure fit. In some embodiments, the substrate may be molded around the thermally conductive inlay. Passive components may be surface mounted on the first substrate (904b). In embodiments, the passive components may be mounted, for example by soldering, on at least some of a number of metal contacts on a first or top surface of the first substrate. In embodiments, vias and other surface metallization may already be formed on the first substrate when the thermally conductive inlay is embedded or may be formed after.

An LED array, such as a micro-LED array, may be attached to a first or top surface of a silicon backplane (906b). In embodiments, the LED array may include an array of connectors, such as copper pillar bumps, and they may be individually coupled to drivers in the silicon backplane by soldering, reflow or other methods. A thermally conductive material may be dispensed on the first substrate (908b). In embodiments, the thermally conductive material may be dispensed on at least a metal pad attached to or part of the thermally conductive inlay. In other embodiments, the thermally conductive material may be dispensed directly on at least the thermally conductive inlay. In some embodiments, the thermally conductive material may cover an entirety of the first or top surface of the first substrate. In embodiments, the thermally conductive material may be silver. The backplane with the LED array attached may be die attached to the first substrate (910b), for example by placing it on the thermally conductive material and allowing it to cure.

The backplane may be wirebond attached to the first substrate (912b). This may be done, for example, using ribbon wire, flexible circuit, or other connector and soldering or otherwise electrically coupling metal contacts, pads or pins on the backplane to metal contacts, pads or pins on the first or top surface of the first substrate. An encapsulant material, such as described in detail above, may be dispensed on or molded around the wirebonds (914b) (e.g., ribbon wires, flexible circuits, or other conductive connectors). In embodiments, this may result in the wirebonds being completely covered by the encapsulant material.

A second substrate (e.g., a circuit board) may be attached to a heat sink (920), for example using a thermally conductive material such as a TIM. In some embodiments, the first substrate may be embedded in the second substrate (922a). In such embodiments, this may be done by placing the first substrate in an opening in the second substrate, and attaching the first substrate to a first or top surface of the heat sink, using a thermally conductive material, such as a TIM. In embodiments, the second substrate may have an embedded second thermal inlay, which may include or have a separately attached metal pad, and the first and second metal inlays may be soldered together. The second metal inlay may be embedded in the heat sink, for example, by placing it in an opening in the heat sink and either pressure fitting or bonding the second metal inlay to the heat sink.

In other embodiments, the first substrate may be surface mounted on a second substrate (922b). In embodiments, metal pads or contacts on the second or bottom surface of the first substrate may be soldered or otherwise electrically coupled to metal pads or contacts on a first or top surface of the second substrate. Further, in some embodiments, a thermally conductive inlay embedded in the second substrate may be thermally coupled to the thermally conductive inlay embedded in the first substrate, for example by soldering pads on or part of both thermally conductive inlays together or directly soldering the thermally conductive inlays together.

The first substrate may be wirebonded to the second substrate (924). This may be done, for example, using ribbon wire, flexible circuit, or other connector and soldering or otherwise electrically coupling metal contacts, pads or pins on the first substrate to metal contacts, pads or pins on the first or top surface of the second substrate. An encapsulant material, such as described in detail above, may be dispensed on or molded around the wirebonds (e.g., ribbon wires, flexible circuits, or other conductive connectors). In embodiments, this may result in the wirebonds being completely covered by the encapsulant material.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A device comprising:
a packaging substrate having a top surface and a bottom surface;
a hybridized device having a bottom surface on the top surface of the packaging substrate, the hybridized device comprising:
a silicon backplane comprising a plurality of input/output (I/O) pins, each of the plurality of I/O pins corresponding to one of a plurality of digital interfaces or one of a plurality of external power supplies, and
a light-emitting diode (LED) array having a bottom surface on a top surface of the silicon backplane;
a plurality of passive components on the top surface of the packaging substrate, the plurality of passive components comprising at least one de-coupling capacitor corresponding to each of the plurality of external power supplies, at least one resistor for setting an LED current, and a crystal for setting a frequency for at least one of the plurality of digital interfaces; and
a plurality of conductive connectors electrically coupled between the top surface of the hybridized device and the top surface of the packaging substrate.

2. The device of claim 1, wherein the plurality of passive components are within 10 mm of at least one of the plurality of I/O pins.

3. The device of claim 1, wherein the hybridized device is on a central region of the top surface of the packaging substrate and the plurality of passive components surround the hybridized device on the top surface of the packaging substrate.

4. The device of claim 1, wherein the LED array is a monolithic array comprising 20,000 or more plurality of light-emitting segments spaced 20 μm or less apart.

5. The device of claim 1, wherein the packaging substrate is a multiple layer circuit board.

6. The device of claim 5, wherein a top layer of the multiple layer circuit board comprises the plurality of passive components and an analog ground, and a layer of the multiple layer circuit board below the top layer comprises a digital ground plane.

7. The device of claim 6, wherein another layer of the multiple layer circuit board below the top layer comprises control signal routing.

8. The device of claim 5, wherein a bottom layer of the multiple layer circuit board comprises a plurality of conductive pads, at least some of the plurality of conductive pads being electrically coupled to a respective one of the plurality of passive components by a through-circuit board connector.

9. The device claim 5, further comprising a metal member embedded in the packaging substrate, extending through all layers of the multiple layer circuit board, and having a top surface thermally coupled to a bottom surface of the hybridized device.

10. A device comprising:
a hybridized device comprising:
a silicon backplane comprising a plurality of input/output (I/O) pins, and
a light-emitting diode (LED) array having a bottom surface on a top surface of the silicon backplane; and
a packaging substrate, a bottom surface of the hybridized device being on a top surface of the packaging substrate, the packaging substrate comprising:
a plurality of passive components on the top surface,
a plurality of contacts on the top surface, and
a plurality of conductive connectors electrically coupled between the I/O pins and the plurality of contacts,
at least a first group of the plurality of contacts corresponding to an external LED power supply, a second group of the plurality of contacts corresponding to an external analog power supply, and a third group of the plurality of contacts corresponding to an external digital power supply.

11. The device of claim 10, wherein a first group of the plurality of passive components for the first external power supply is adjacent the first group of the plurality of contacts and a second group of the plurality of passive components for the second external power supply is adjacent the second group of the plurality of contacts.

12. The device of claim 10, wherein a third group of the plurality of passive components for the third external power supply is adjacent the third group of the plurality of contacts.

13. A device comprising:
a control board having a plurality of top contacts on a top surface of the control board; and
a light-emitting device package comprising:
a hybridized device on a top surface of a packaging substrate, the hybridized device comprising a plurality of input/output (I/O) pins each corresponding to one of a plurality of digital interfaces to the control board or one of a plurality of external power supplies on the control board,
a plurality of bottom contacts on a bottom surface of the packaging substrate,
a plurality of passive components on the top surface of the packaging substrate, the plurality of passive components including at least one de-coupling capacitor corresponding to each of the plurality of external power supplies, at least one resistor for setting an LED current, and a crystal for setting a frequency for at least one of the plurality of digital interfaces,
a plurality of vias electrically coupled between the plurality of passive components on the top surface of the packaging substrate and the plurality of bottom contacts on the bottom surface of the packaging substrate, and
a plurality of conductive connectors electrically coupled between a top surface of the hybridized device and the top surface of the packaging substrate,
the light-emitting device package mounted on the control board with the bottom contacts on the light-emitting device package electrically coupled to the top contacts on the control board.

14. The device of claim 13, wherein the hybridized device comprises a silicon backplane and a monolithic array on the silicon backplane, the monolithic array comprising 20,000 or more plurality of light-emitting segments spaced 20 μm or less apart.

15. The device of claim 14, wherein the packaging substrate is a multiple layer circuit board having a first layer comprising the plurality of passive components and an analog ground, a second layer comprising control signal routing between the silicon backplane and the control board, and a third layer comprising a digital ground plane.

* * * * *